(12) United States Patent
Watanabe

(10) Patent No.: US 11,889,690 B2
(45) Date of Patent: Jan. 30, 2024

(54) SEMICONDUCTOR STORAGE DEVICE

(71) Applicant: Kioxia Corporation, Tokyo (JP)

(72) Inventor: Kenji Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 254 days.

(21) Appl. No.: 17/198,437

(22) Filed: Mar. 11, 2021

(65) Prior Publication Data

US 2022/0045095 A1 Feb. 10, 2022

(30) Foreign Application Priority Data

Aug. 7, 2020 (JP) ................................. 2020-135186

(51) Int. Cl.
| | |
|---|---|
| H10B 41/10 | (2023.01) |
| H10B 43/27 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ............ H10B 43/27 (2023.02); H10B 41/10 (2023.02); H10B 41/27 (2023.02); H10B 41/40 (2023.02); H10B 43/10 (2023.02); H10B 43/40 (2023.02)

(58) Field of Classification Search
CPC ........ H10B 41/27; H10B 43/10; H10B 43/40; H10B 41/40; H10B 41/10; H10B 43/27
See application file for complete search history.

(56) References Cited

U.S. PATENT DOCUMENTS

| | | | | |
|---|---|---|---|---|
| 9,793,287 B2* | 10/2017 | Iguchi | ................... | H10B 43/50 |
| 10,586,804 B2 | 3/2020 | Tomimatsu | | |
| 2008/0303066 A1* | 12/2008 | Yonemochi | ............ | H10B 41/10 |
| | | | | 257/E23.173 |
| 2017/0271263 A1* | 9/2017 | Shinohara | .............. | H10B 43/50 |
| 2018/0277564 A1* | 9/2018 | Sugiura | .................. | H10B 43/40 |
| 2019/0067314 A1* | 2/2019 | Lu | .......................... | H10B 43/50 |
| 2019/0088672 A1* | 3/2019 | Tomimatsu | ........... | H01L 23/562 |
| 2020/0279859 A1* | 9/2020 | Uchida | .................. | H10B 43/40 |

(Continued)

FOREIGN PATENT DOCUMENTS

JP 2019-57623 A 4/2019

*Primary Examiner* — Jay C Chang
*Assistant Examiner* — Siangluai Mang
(74) *Attorney, Agent, or Firm* — Oblon, McClelland, Maier & Neustadt, L.L.P.

(57) ABSTRACT

According to one embodiment, a semiconductor storage device includes a stacked structure in which a plurality of conductive layers is stacked in a stacking direction via an insulating layer, a plurality of pillars extending in the stacking direction in the stacked structure and including a memory cell formed at an intersection between at least a part of the plurality of conductive layers and at least a part of the plurality of pillars, a plurality of first contacts arranged in the stacked structure, each of the first contacts reaching a different depth in the stacked structure and being connected to a conductive layer in a different layer among the plurality of conductive layers, and a plurality of second contacts arranged in the stacked structure separately from the plurality of first contacts, each of the second contacts being connected to a conductive layer identical to the conductive layer to which corresponding one of the plurality of first contacts is connected.

10 Claims, 16 Drawing Sheets

(56) References Cited

U.S. PATENT DOCUMENTS

| | | | |
|---|---|---|---|
| 2020/0312706 A1* | 10/2020 | Cui | H10B 43/27 |
| 2021/0036001 A1* | 2/2021 | Kim | H01L 23/5223 |
| 2022/0059561 A1* | 2/2022 | Noh | H10B 43/50 |

* cited by examiner

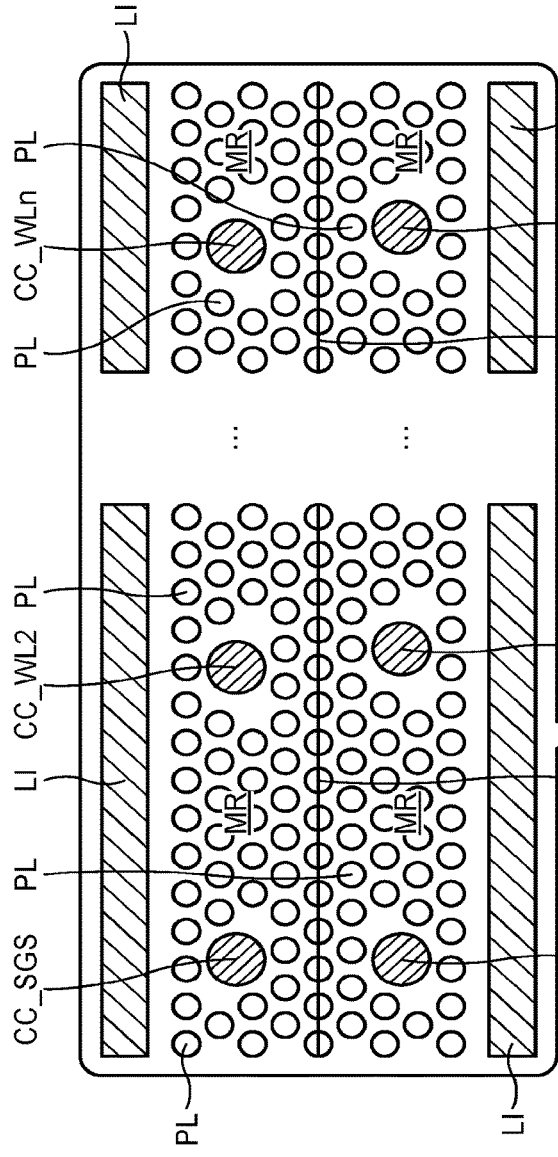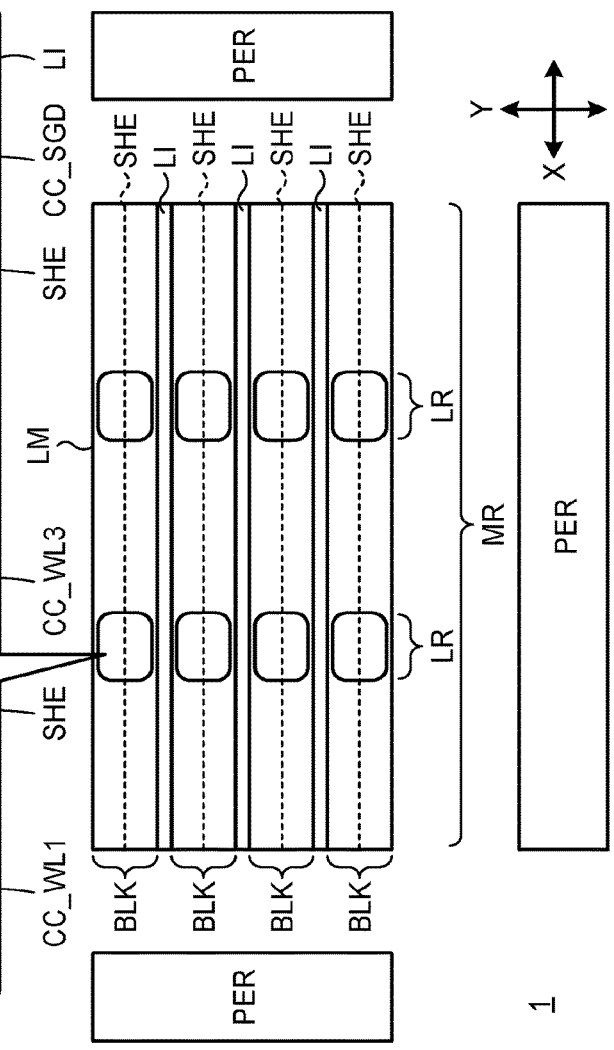
FIG.1B
FIG.1A

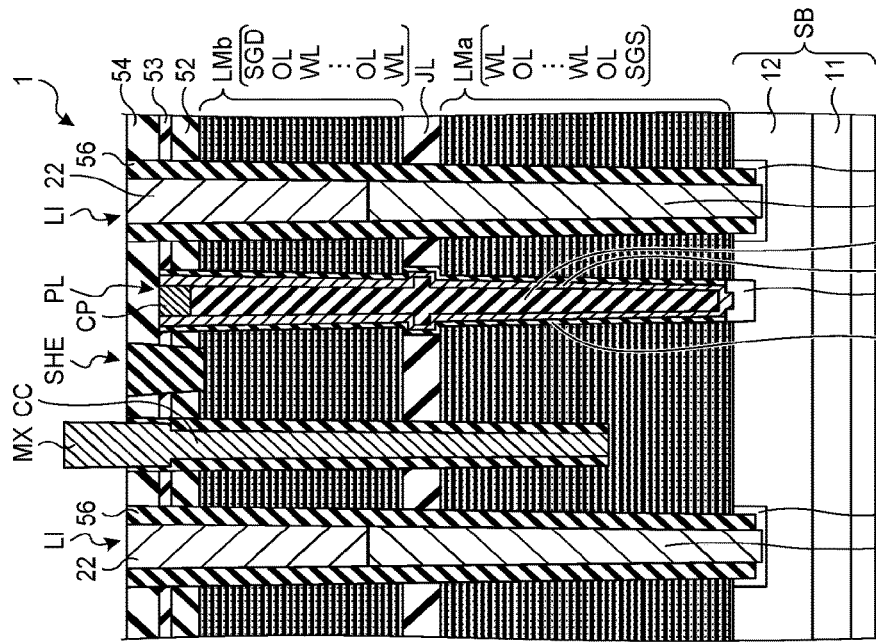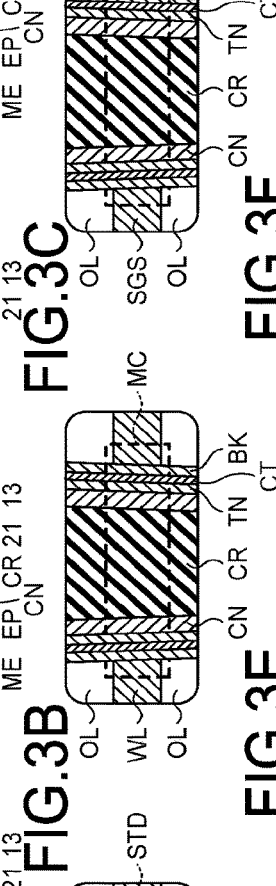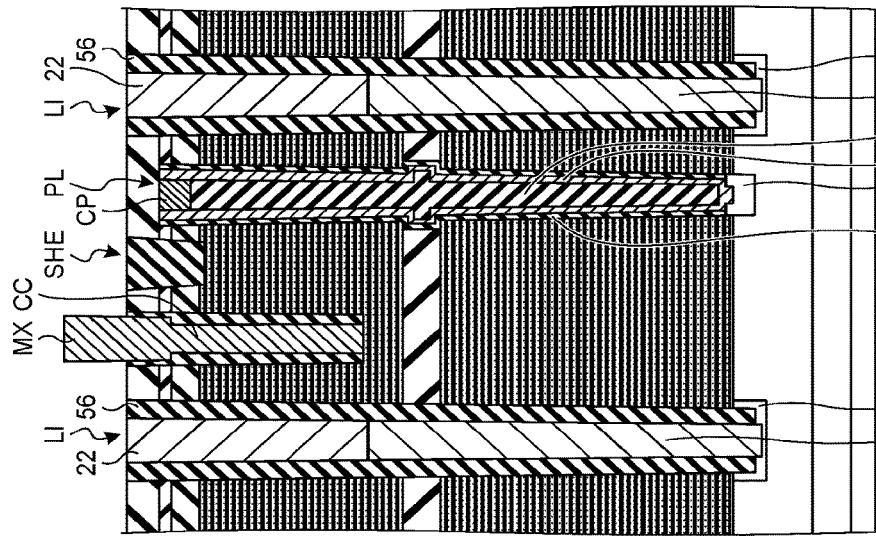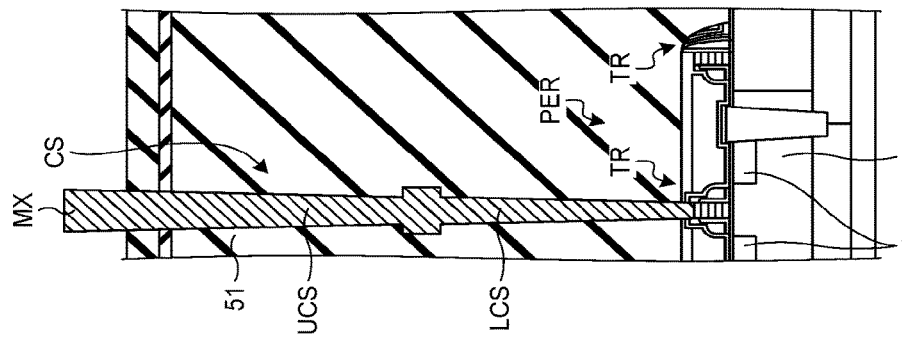

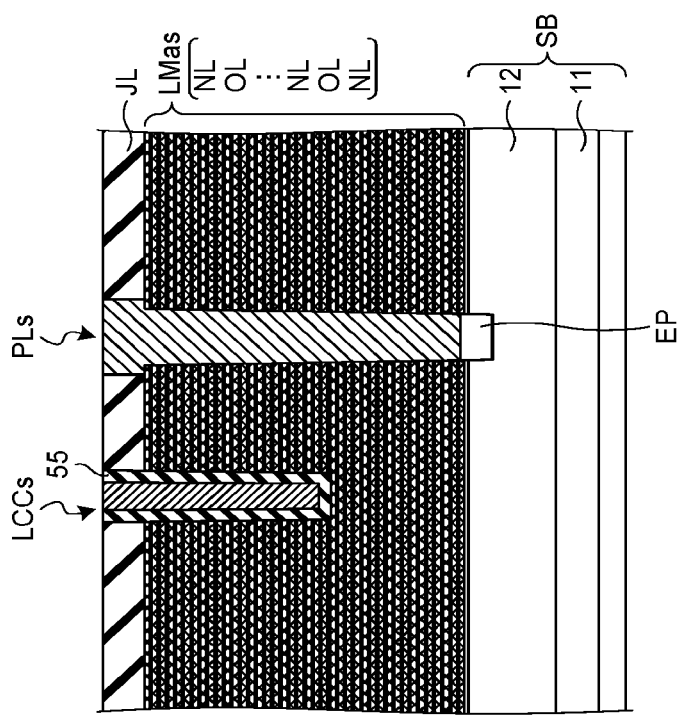
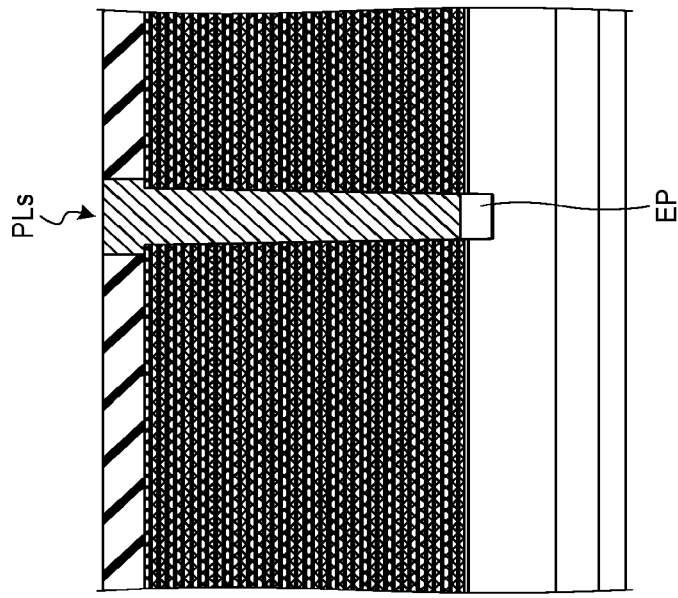
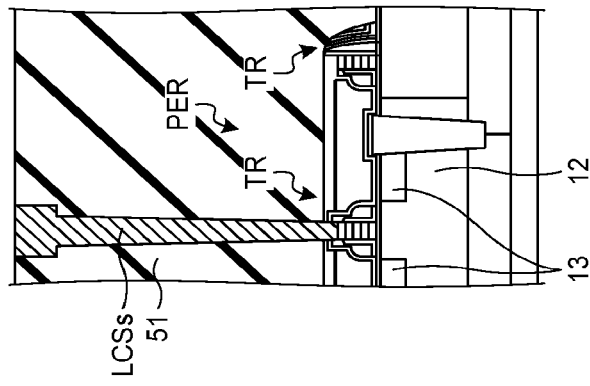

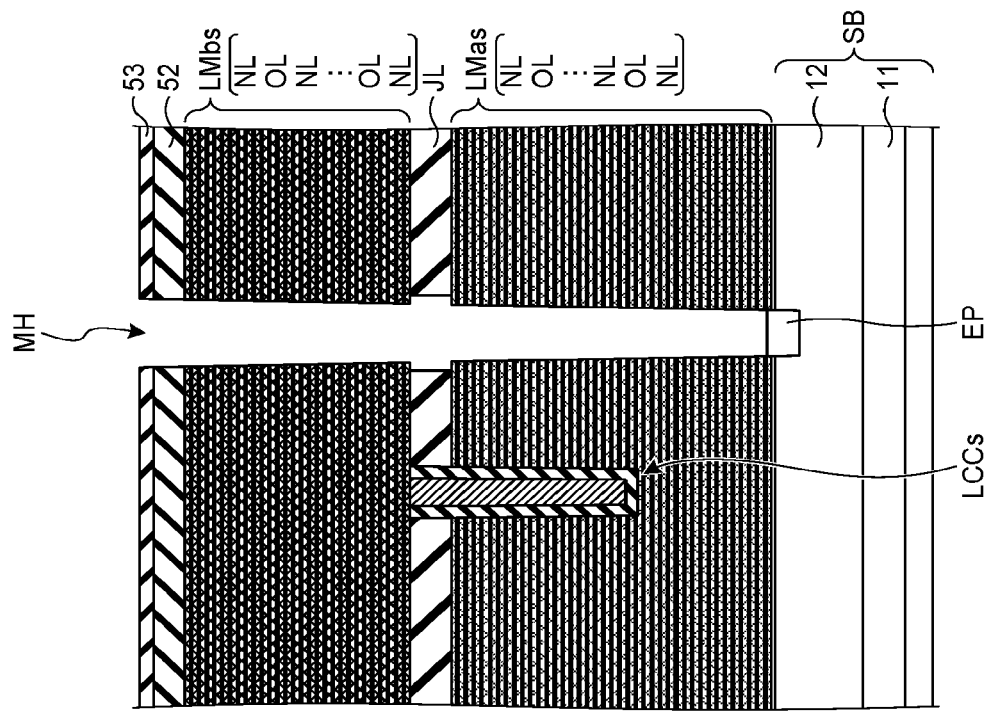

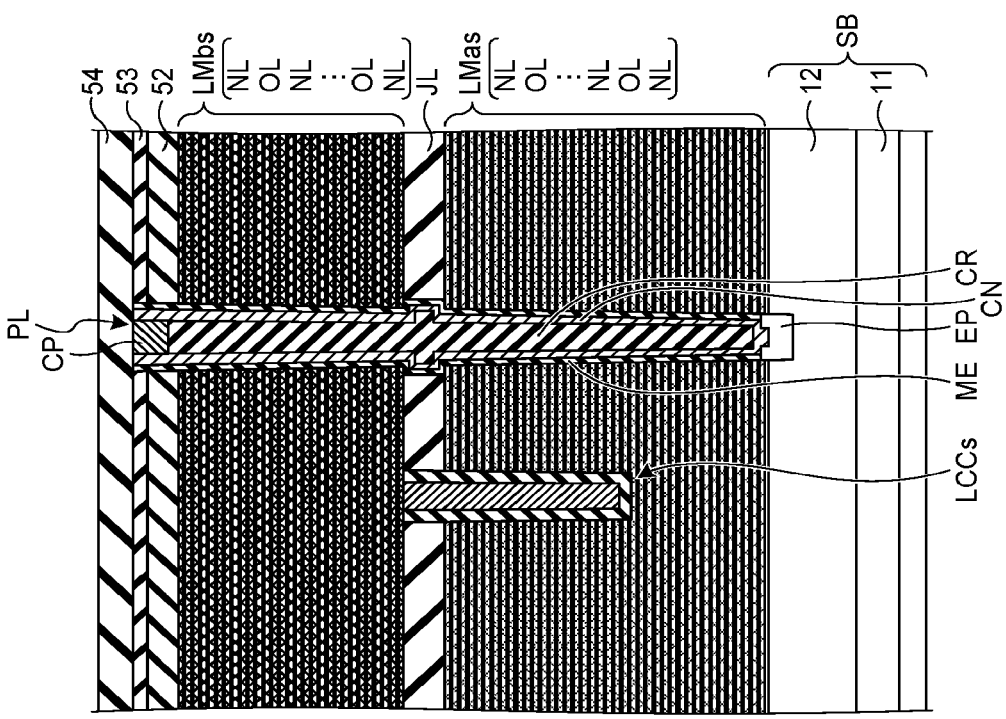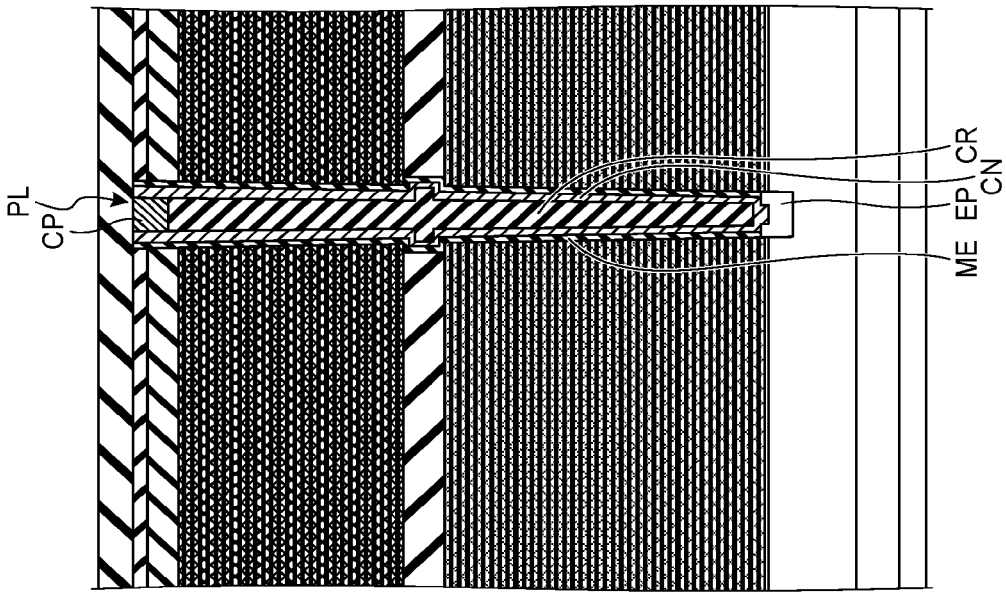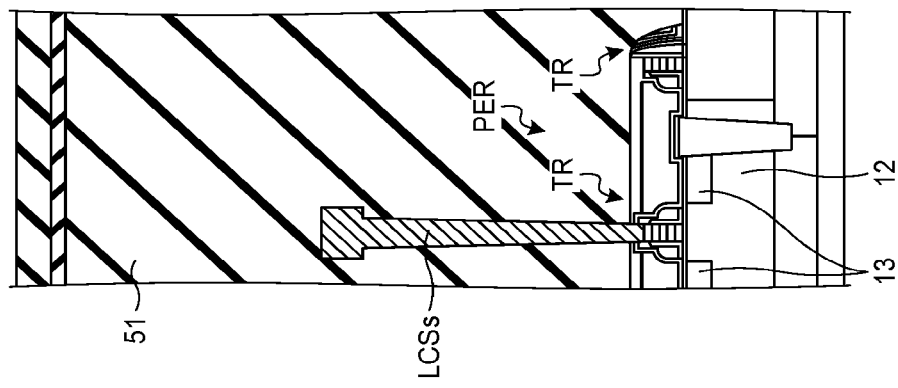

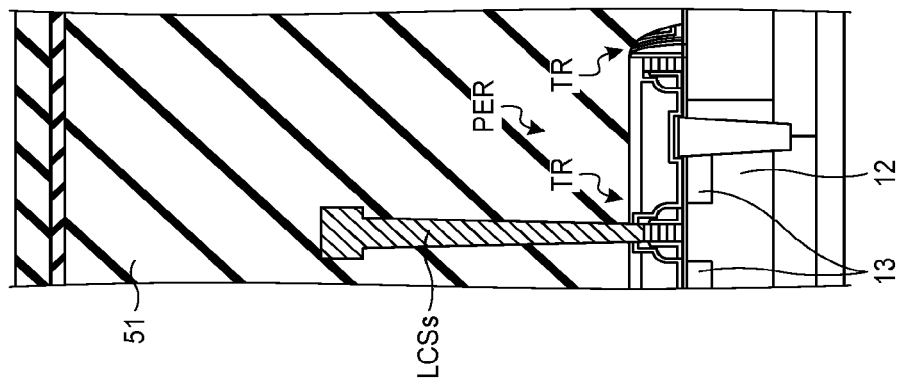
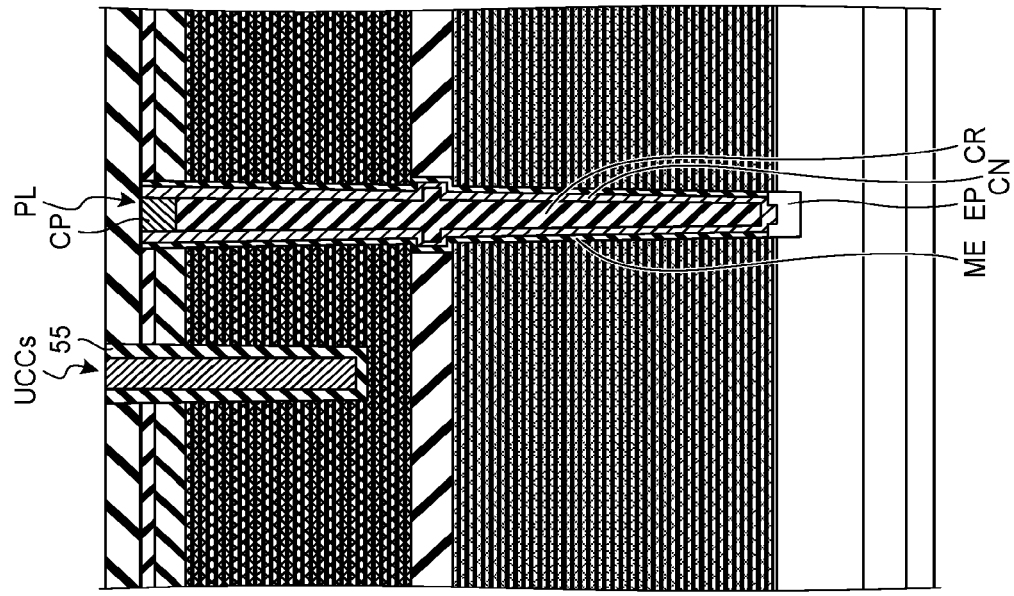
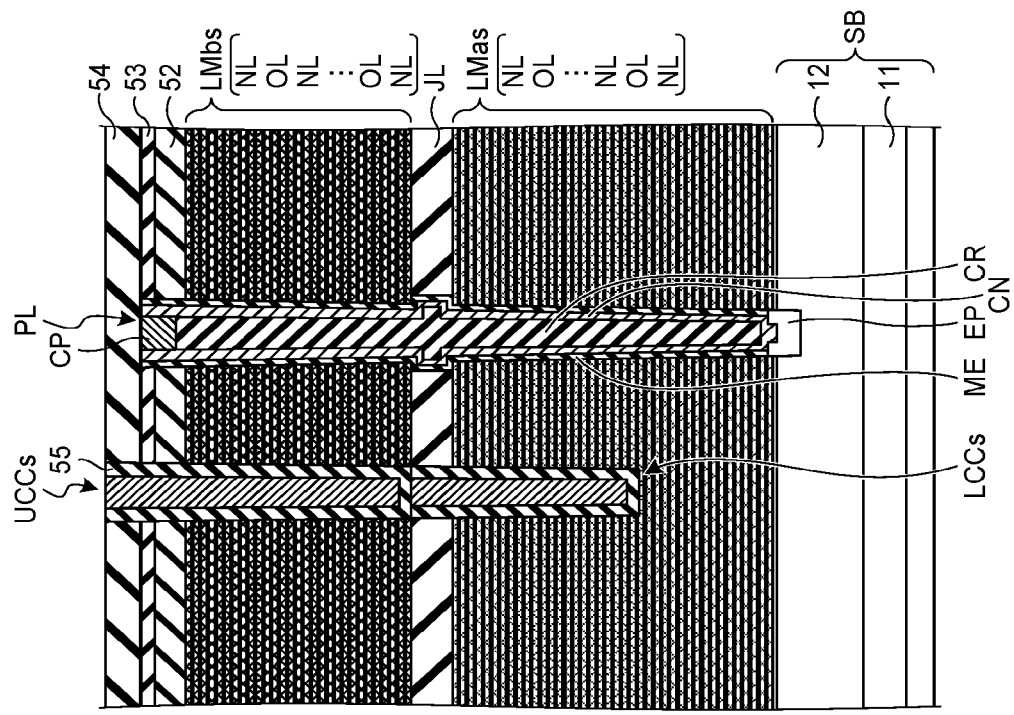

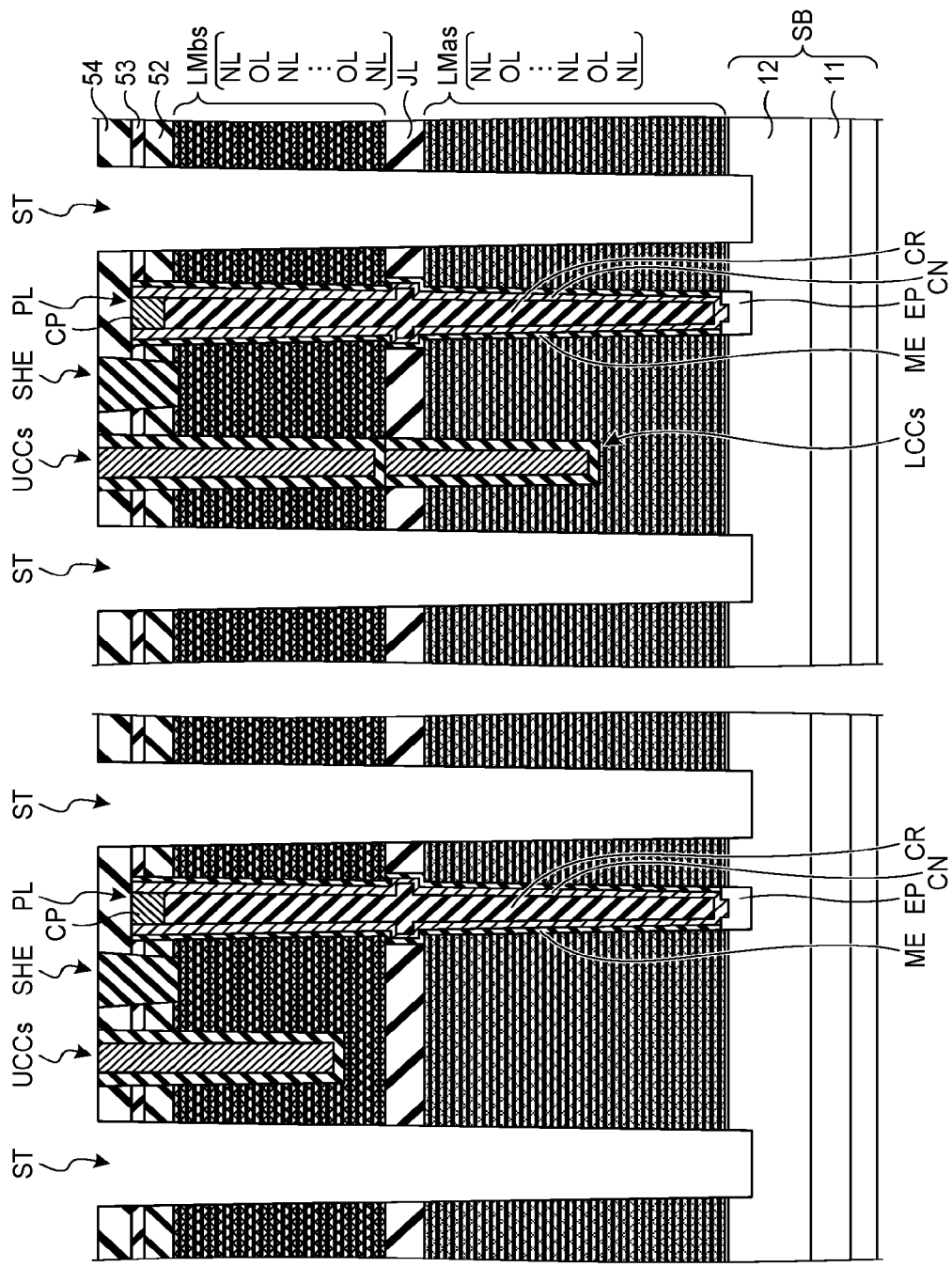

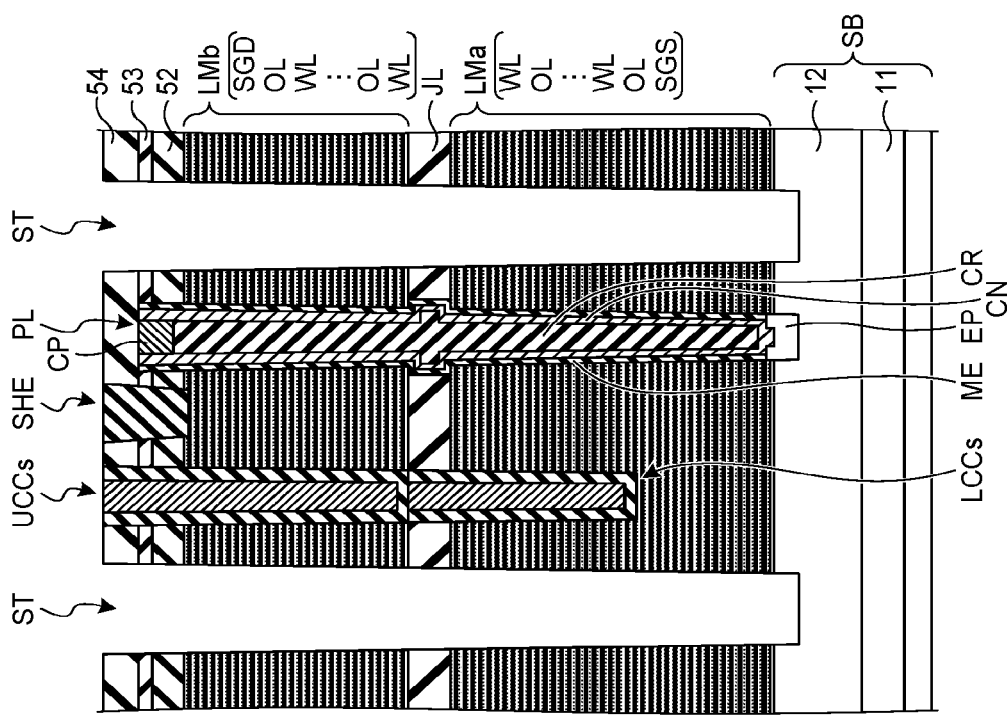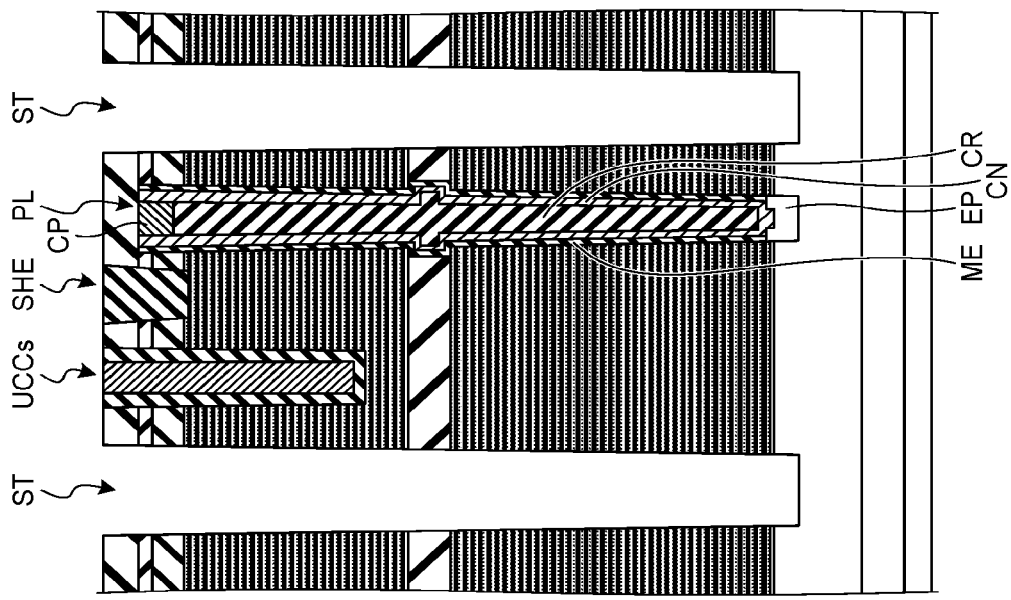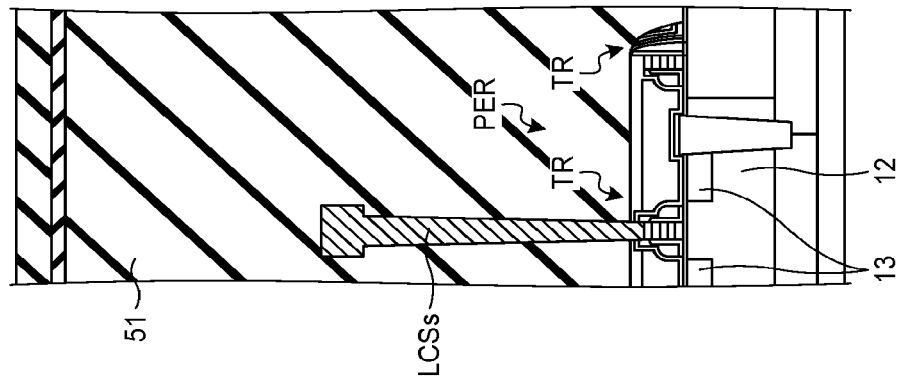

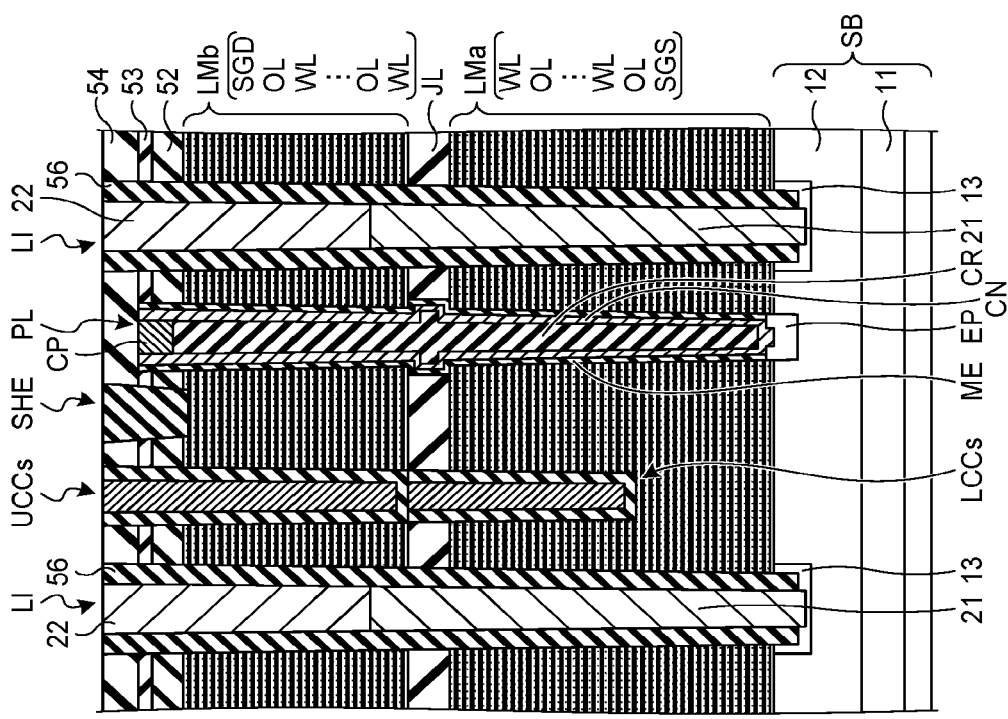
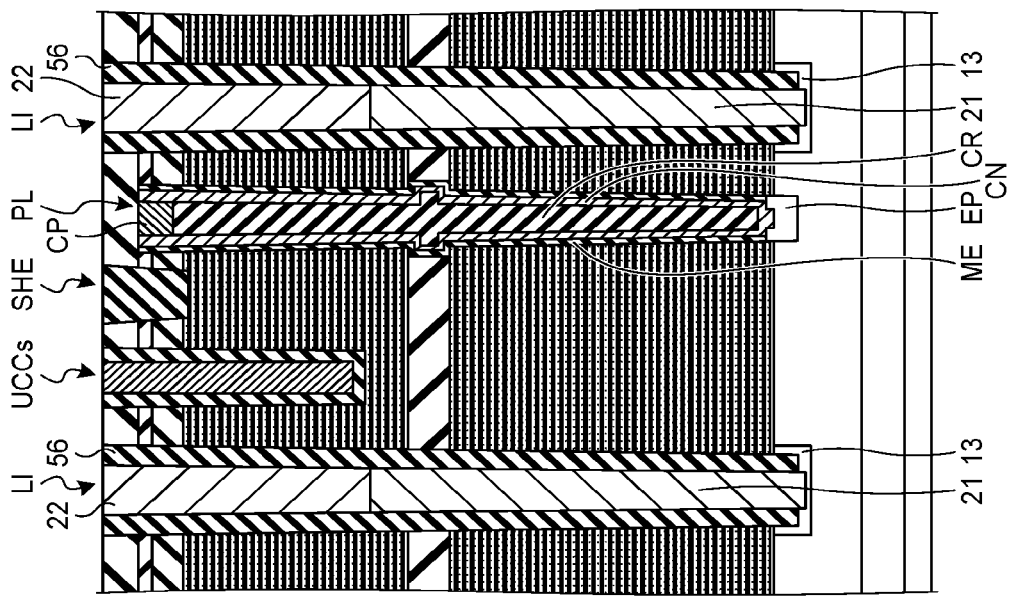
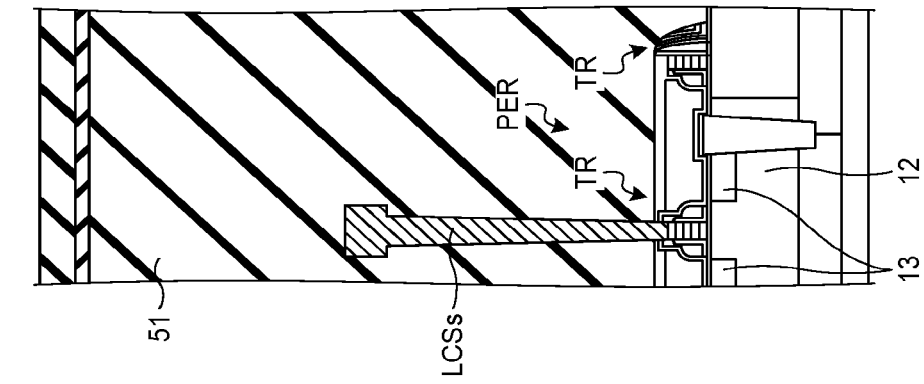

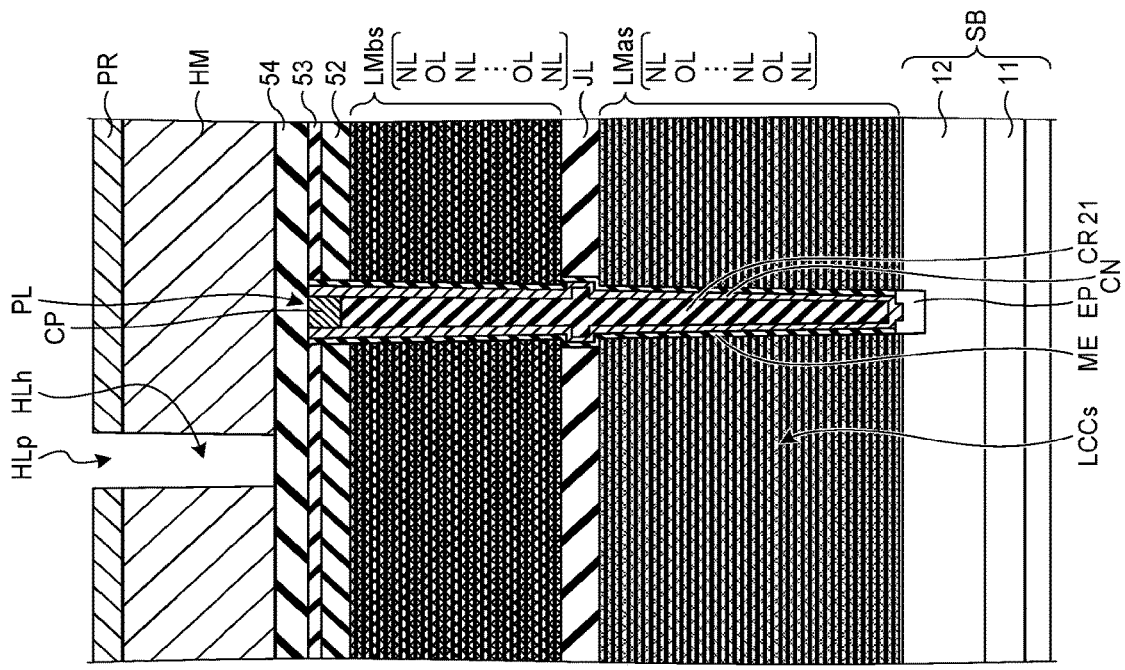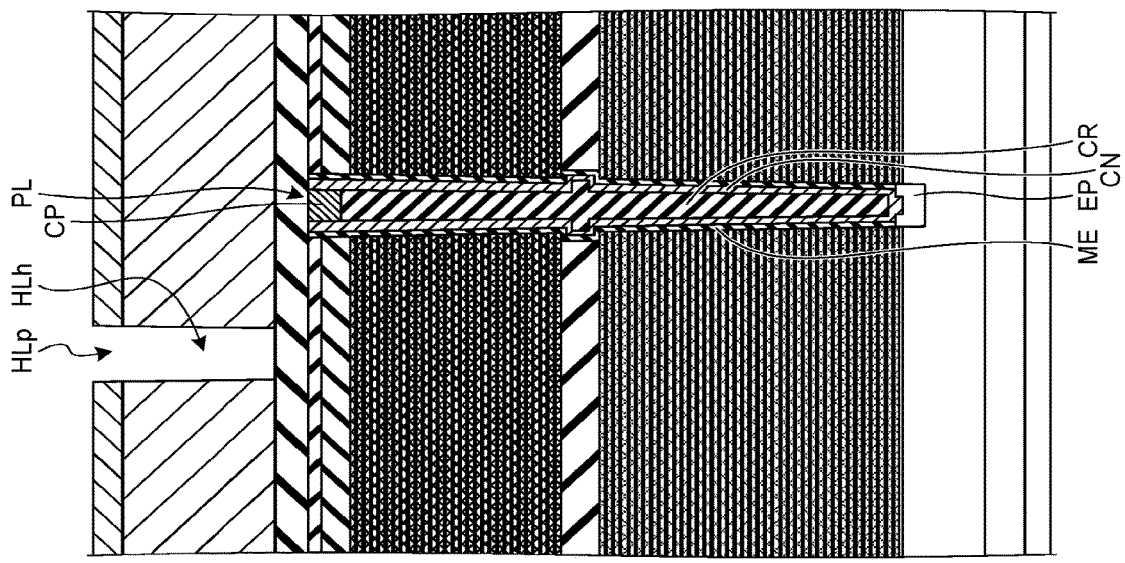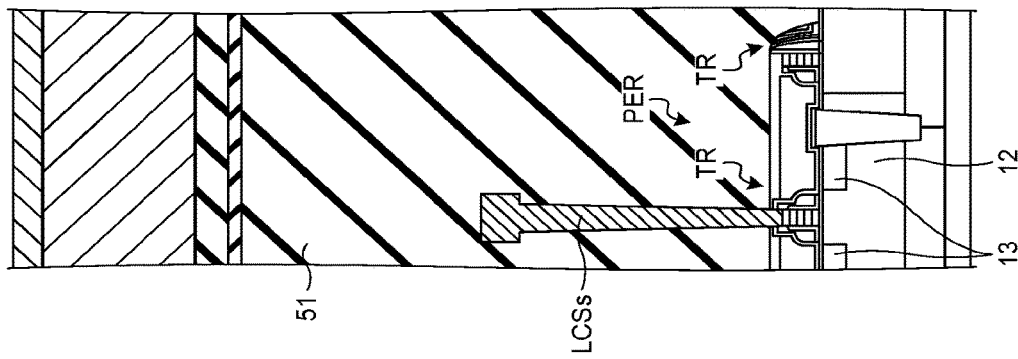

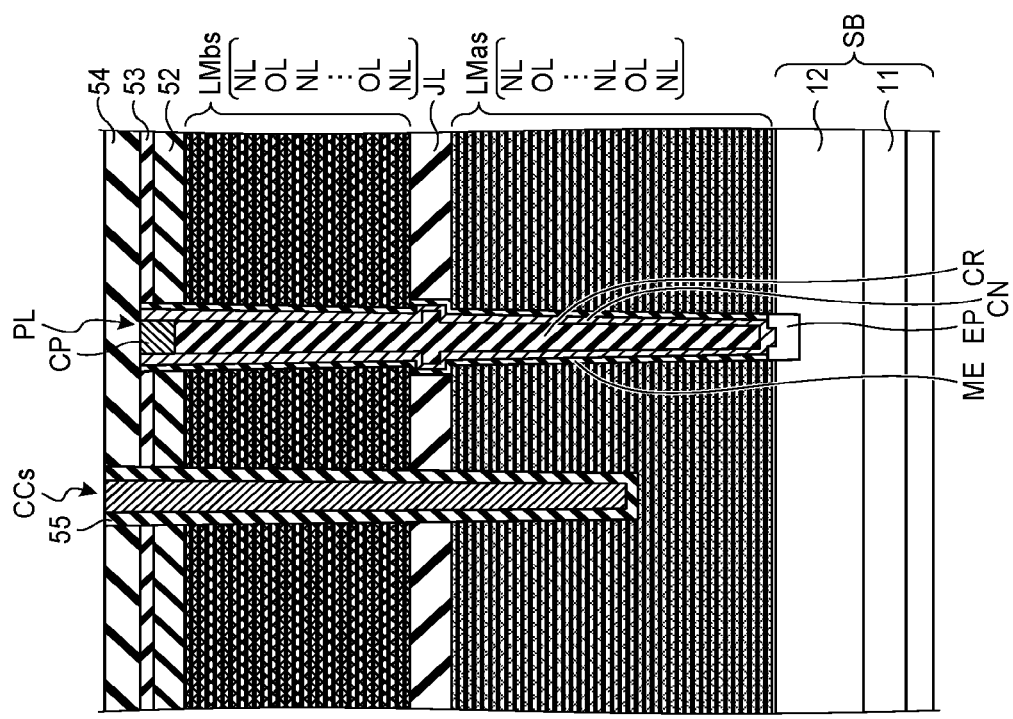
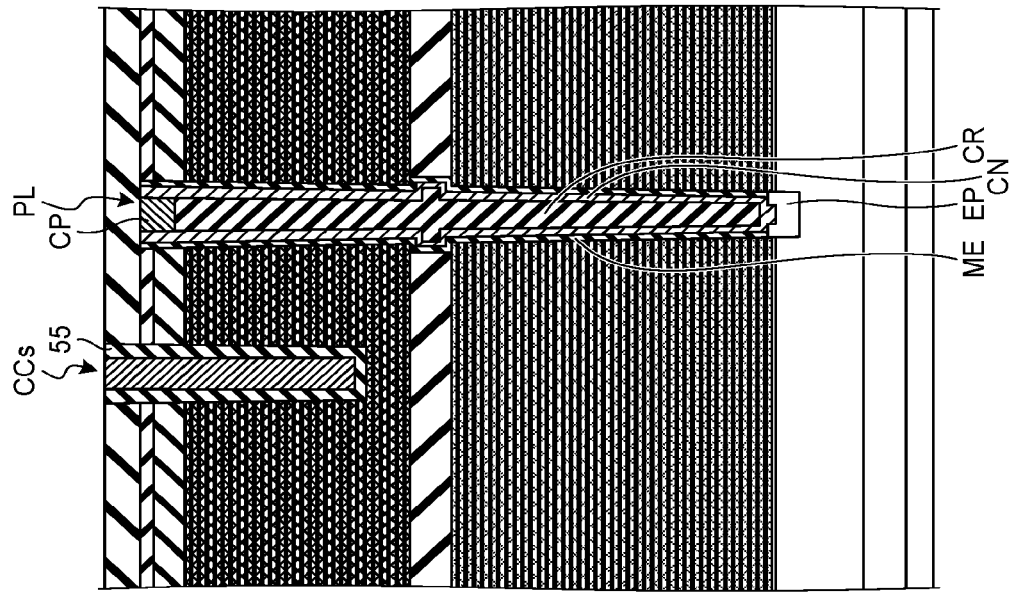
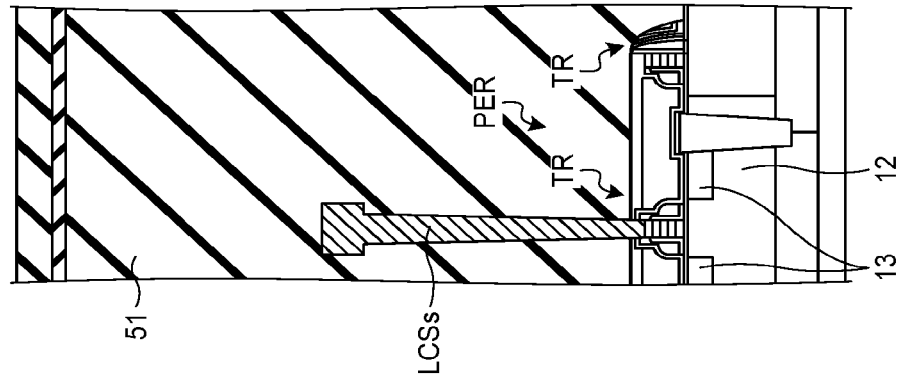

SEMICONDUCTOR STORAGE DEVICE

CROSS-REFERENCE TO RELATED APPLICATIONS

This application is based upon and claims the benefit of priority from Japanese Patent Application No. 2020-135186, filed on Aug. 7, 2020; the entire contents of which are incorporated herein by reference.

FIELD

An embodiment described herein relates generally to a semiconductor storage device.

BACKGROUND

In a three-dimensional nonvolatile memory, for example, memory cells are arranged three-dimensionally in a stacked structure in which a plurality of conductive layers is stacked on top of each other. In one example, it is possible to provide a stairway area with the stepped conductive layers at the end portion of the stacked structure and apply a voltage from the stairway area to the conductive layer. In this case, it is desirable to reduce or eliminate voltage drop at a position away from the end portion of the stacked structure.

BRIEF DESCRIPTION OF THE DRAWINGS

FIGS. 1A and 1B are plan views of a semiconductor storage device according to an embodiment;

FIGS. 3A to 3F are Y-direction sectional views illustrating an example of the configuration of the semiconductor storage device according to the embodiment;

FIGS. 7A to 7C are sectional views illustrating the example of the procedure of the method of manufacturing the semiconductor storage device according to the embodiment;

FIGS. 8A to 8C are sectional views illustrating the example of the procedure of the method of manufacturing the semiconductor storage device according to the embodiment;

FIGS. 9A to 9C are sectional views illustrating the example of the procedure of the method of manufacturing the semiconductor storage device according to the embodiment;

FIGS. 10A to 10C are sectional views illustrating the example of the procedure of the method of manufacturing the semiconductor storage device according to the embodiment;

FIGS. 11A to 11C are sectional views illustrating the example of the procedure of the method of manufacturing the semiconductor storage device according to the embodiment;

FIGS. 12A to 12C are sectional views illustrating the example of the procedure of the method of manufacturing the semiconductor storage device according to the embodiment;

FIGS. 13A to 13C are sectional views illustrating the example of the procedure of the method of manufacturing the semiconductor storage device according to the embodiment;

FIGS. 14A to 14C are sectional views illustrating an example of a procedure of a method of manufacturing the semiconductor storage device according to a modification of the embodiment;

FIGS. 16A to 16C are sectional views illustrating the example of the procedure of the method of manufacturing the semiconductor storage device according to the modification of the embodiment.

DETAILED DESCRIPTION

Figure 2:
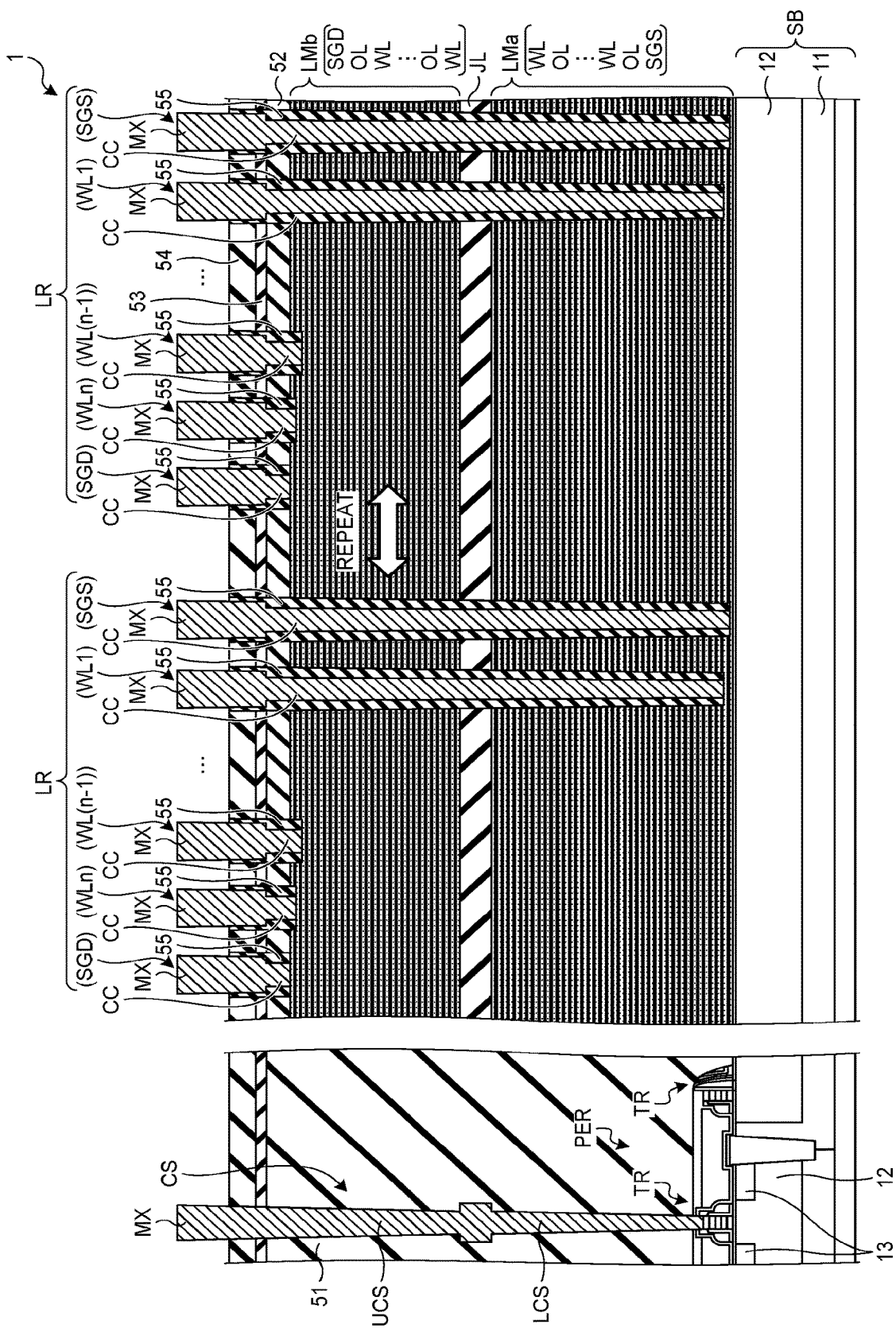
FIG. 2 is a schematic sectional view illustrating an exemplary configuration of a contact of the semiconductor storage device according to the embodiment.

A semiconductor storage device according to an embodiment includes a stacked structure in which a plurality of conductive layers is stacked in a stacking direction via an insulating layer, a plurality of pillars extending in the stacking direction in the stacked structure and including a memory cell formed at an intersection between at least a part of the plurality of conductive layers and at least a part of the plurality of pillars, a plurality of first contacts arranged in the stacked structure, each of the first contacts reaching a different depth in the stacked structure and being connected to a conductive layer in a different layer among the plurality of conductive layers, and a plurality of second contacts arranged in the stacked structure separately from the plurality of first contacts, each of the second contacts reaching a different depth in the stacked structure and being connected to a conductive layer identical to the conductive layer to which corresponding one of the plurality of first contacts is connected.

The present invention is now described in detail with reference to the accompanying drawings. Note that the present invention is not limited to an embodiment described below. Besides, the components in the embodiment described below include those that can be easily conceivable to those skilled in the art or those that are substantially the same.

(Exemplary Configuration of Semiconductor Storage Device)

FIGS. 1A and 1B are plan views of a semiconductor storage device 1 according to an embodiment. FIG. 1A is a schematic plan view illustrating the layout of the semiconductor storage device 1, and FIG. 1B is a partially enlarged plan view of FIG. 1A.

As illustrated in FIGS. 1A and 1B, the semiconductor storage device 1 includes a stacked structure LM in which a plurality of word lines or the like is stacked and a peripheral circuit PER arranged around the stacked structure LM.

The stacked structure LM has a configuration in which a plurality of word lines is stacked and each of selection gate lines is arranged in the lower layer of the lowermost word line and in the upper layer of the uppermost word line. Each of these word lines and selection gate lines has a longitudinal direction, for example, along the X-direction.

A plurality of contacts LI extends in the stacked structure LM in the X-direction and divides the stacked structure LM in the Y-direction. Each region sandwiched between a plurality of contacts LI is called a block BLK. Within one block BLK, a separation layer SHE extends in the X-direction between two contacts LI to separate the selection gate lines on the upper layer side of the stacked structure LM.

In other words, the side on which the separation layer SHE is herein arranged with respect to the stacked structure LM is defined as the upward direction.

Each block BLK includes a memory region MR extending over the entire area of the block BLK and a plurality of lead-out regions LR arranged in the memory region MR separated from each other by a predetermined distance in the X-direction. In the example of FIG. 1A, two lead-out regions LR are arranged in one block BLK. However, it is sufficient that two or more lead-out regions LR are arranged in one block BLK, and the number of lead-out regions LR is optional. Moreover, at least one of the plurality of lead-out regions LR is desirably arranged in a region other than the end portion of the stacked structure LM in the X-direction.

In the memory region MR, a plurality of pillars PL that penetrates the stacked structure LM is arranged in a matrix. The memory cell is formed at the intersection of each pillar PL and each word line.

In this way, the semiconductor storage device 1 is configured as three-dimensional nonvolatile memory in which a plurality of memory cells is three-dimensionally arranged in the memory region MR.

Some of the plurality of pillars PL in the memory region MR are arranged in each lead-out region LR in which a plurality of contacts CC is arranged in a mixed way with some of these pillars PL. In other words, a plurality of pillars PL surrounds each contact CC. Moreover, at least a part of the plurality of pillars PL arranged in the lead-out region LR can be used as a dummy pillar in which the memory cell valid for reading and writing data is not formed at the intersection with the word line.

In one example, some of these contacts CC reach different depths in the stacked structure LM and are connected to different layers of the word lines.

In the enlarged view of FIG. 1B, the contact CC followed by "WL1" is the contact CC connected to a lowermost word line WL1. Similarly, the contact CC followed by "WL2" is the contact CC connected to a second word line WL2 from the lowermost layer, and the contact CC followed by "WL3" is the contact CC connected to a third word line Wl3 from the lowermost layer. In addition, the contact CC followed by "WLn" is a contact CC connected to an uppermost word line WLn (where n is an integer of four or more).

Further, another contact CC reaches the depth of the selection gate line on the lower layer side and is connected to the selection gate line on the lower layer side. In addition, yet another contact CC reaches the depth of the selection gate line on the upper layer side and is connected to the selection gate line on the upper layer side.

As described above, each of the word lines or the like stacked in multiple layers is led out above the stacked structure LM by this plurality of contacts CC.

In the enlarged view of FIG. 1B, the contact CC followed by "SGS" is a contact CC connected to a selection gate line SGS on the lower layer side. Similarly, the contact CC followed by "SGD" is a contact CC connected to a selection gate line SGD on the upper layer side. The selection gate line SGD in one block BLK is separated into two by the separation layer SHE, so two contacts CC are connected to the selection gate line SGD with the separation layer SHE in between.

The peripheral circuits PER are arranged, for example, with respect to the stacked structure LM, on both sides in the X-direction and one side in the Y-direction. The peripheral circuit PER includes, for example, a transistor and controls the voltage applied to each memory cell via the plurality of contacts CC and the plurality of word lines.

FIG. 2 is an X-direction schematic sectional view illustrating an exemplary configuration of a contact CC of the semiconductor storage device 1 according to the embodiment. In FIG. 2, some components, such as the pillar PL, are omitted.

As illustrated in FIG. 2, the plurality of contacts CC is arranged on stacked structures LMa and LMb that are stacked on a substrate SB such as a silicon substrate. The substrate SB has an n-well 11 formed in the surface layer portion, a p-well 12 formed in the n-well 11, and a plurality of diffusion regions 13 formed in the p-well 12. The stacked structure LMa is stacked on top of the substrate SB, and the stacked structure LMb is stacked on top of the stacked structure LMa via a junction layer JL that covers the stacked structure LMa. The junction layer JL is an insulating layer such as a $SiO_2$ layer. A plurality of insulating layers 52 to 54 such as a $SiO_2$ layer is arranged on the stacked structure LMb in this order from the stacked structure LMb side.

The stacked structures LMa and LMb each have a configuration in which conductive layers and insulating layers are alternately stacked layer by layer. The lowermost conductive layer of the stacked structure LMa is the selection gate line SGS, and the other conductive layers are the word lines WL. However, the selection gate line SGS can be arranged over a plurality of layers from the lowermost layer. The uppermost conductive layer of the stacked structure LMb is the selection gate line SGD, and the other conductive layers are the word lines WL. However, the selection gate line SGD can be arranged over a plurality of layers from the uppermost layer. These selection gate lines SGS and SGD and word lines WL are, for example, a tungsten layer or a molybdenum layer. The stacked structures LMa and LMb are each provided with an insulating layer OL such as a $SiO_2$ layer between these selection gate lines SGS and SGD and word lines WL.

FIG. 2 illustrates two lead-out regions LR as the first and second regions arranged in the X-direction. Each lead-out region LR includes a plurality of contacts CC as the first contacts or the second contacts that penetrate the insulating layers 54 to 52 and reach different depths in the stacked structures LMa and LMb. This allows each of the plurality of contacts CC to be connected to one of the selection gate lines SGS and SGD or to the word line WL of a different layer among the plurality of word lines WL. Moreover, at least a partial region of the memory region MR, which is a region other than the lead-out region LR in the stacked structures LMa and LMb, is sometimes called a third region.

Here, the two lead-out regions LR are arranged in regions in the stacked structures LMa and LMb where the number of stacked layers is equal to each other, and the contacts CC corresponding to each other, i.e., contacts CC connected to the word lines WL or the like of the same layer are included in the respective lead-out regions LR. In one example, in the example of FIG. 2, a contact CC connected to the selection gate line SGD, which is provided commonly in each lead-out region LR, is illustrated on the leftmost side of the sheet in each lead-out region LR. In addition, the example of FIG. 2 illustrates a contact CC connected to the uppermost word line WLn (where n is an integer of four or more) and a contact CC connected to the second word line WL (n−1) from the uppermost layer. The example of FIG. 2 also illustrates a contact CC connected to the lowermost word line WL1, and a contact CC connected to the selection gate line SGS. These contacts CC are provided commonly in both lead-out regions LR. Moreover, the memory region MR as the third region described above is also a region in which the number of stacked layers in the stacked structures LMa and LMb is equal to the two lead-out regions LR.

However, the example of FIG. 2 does not mean that the contact CC connected to the word lines WL or the like of different layers is arranged in the X-direction. In one example, as in the example of FIG. 1B described above, the respective contacts CC are optionally arranged in one lead-out region LR, such as being arranged across the separation layer SHE. In addition, all the contacts CC connected to the word lines WL or the like of different layers are not necessarily arranged together in a local region, that is, one lead-out region LR. Besides, they can be distributed and arranged in, for example, a plurality of regions in the stacked structures LMa and LMb. In this event, the contacts CC as the first and second contacts connected to the same word line WL are desirably arranged at a predetermined distance from each other. Besides, at least one of these contacts CC is desirably arranged in a region other than the end portions of the stacked structures LMa and LMb.

The respective contacts CC include, for example, a tungsten layer and are connected to one of the selection gate lines SGS and SGD or the word line WL of a different layer among a plurality of word lines WL at the bottom surface. In addition, the respective contacts CC are provided with an insulating layer 55 such as a $SiO_2$ layer arranged on the sidewalls, and so are insulated from the word line WL or the like that is not a connection target.

A wiring layer MX such as a tungsten layer is connected to the upper surface of each contact CC. The wiring layer MX is arranged in an insulating layer, which is not illustrated, is arranged in the upper layers of the insulating layers 52 to 54, penetrates the insulating layers 54 and 53, and is connected to the contact CC.

The peripheral circuit PER is arranged in the outer region of the stacked structures LMa and LMb. The peripheral circuit PER includes a plurality of transistors TR. The plurality of transistors TR is arranged on the substrate SB, for example, across the plurality of $n^+$ diffusion regions 13 on the surface layer of the substrate SB. The plurality of transistors TR is covered with, in one example, an insulating layer 51 that reaches at least a height position on the upper surface of the stacked structure LMb. The insulating layers 53 and 54 and like layers are arranged on the insulating layer 51.

A contact CS is connected to each of the plurality of transistors TR. The contact CS is, for example, a tungsten layer or the like, and penetrates the insulating layers 51, 53, 54, or the like and is connected to the transistor TR. The contact CS includes a contact LCS arranged at the height position of the stacked structure LMa, that is, the same layer as the stacked structure LMa, and a contact UCS arranged at the height position of the stacked structure LMb, that is, the same layer as the stacked structure LMb. The lower end of the contact LCS is connected to the transistor TR, and the upper end of the contact LCS is electrically connected to the lower end of the contact UCS. The upper end of the contact UCS is connected to the wiring layer MX. Thus, the contact CS is connected to the contact CC of the lead-out region LR via the wiring layer MX.

The configuration described above allows the peripheral circuit PER to control the voltage applied to the selection gate lines SGS and SGD and the plurality of word lines WL of each layer via the contacts CS and CC and the wiring layer MX. In other words, a set of the contacts CC, which belong to each of the plurality of lead-out regions LR and are arranged at different positions of the stacked structures LMa and LMb, applies a voltage having the same potential to the identical word lines WL or the like in different regions of the stacked structures LMa and LMb.

FIGS. 3A to 3F are Y-direction sectional views illustrating an example of the configuration of the semiconductor storage device 1 according to the embodiment.

FIG. 3A is a sectional view taken along the Y-direction of the peripheral circuit PER of the semiconductor storage device 1. FIG. 3B is a sectional view taken along the Y-direction of the lead-out region LR sandwiched between the contacts LI. FIG. 3C is a sectional view taken along the Y-direction at a different position of the lead-out region LR.

FIG. 3D is an enlarged sectional view of the pillar PL near the selection gate line SGD. FIG. 3E is an enlarged sectional view of the pillar PL near the word line WL. FIG. 3F is an enlarged sectional view of the pillar PL near the selection gate line SGS.

As illustrated in FIG. 3A, the configuration of the peripheral circuit PER is as described above.

As illustrated in FIGS. 3B and 3C, the separation layer SHE is arranged between the two contacts LI. The pillar PL and the contact CC are arranged in the lead-out region LR between the two contacts LI. FIGS. 3B and 3C each exemplarily illustrate one pillar PL and one contact CC. However, as illustrated in FIG. 1B or other drawings described above, the plurality of contacts CC is arranged in the lead-out region LR in a mixed way with a plurality of pillars PL arranged in a matrix between the two contacts LI.

Moreover, although illustrated for simplicity in FIGS. 3B and 3C, the pillar PL can also be arranged at the arrangement position of the separation layer SHE to maintain a regular arrangement of the plurality of pillars PL (refer to FIG. 1B). In this case, the upper part of the pillar PL interferes with the separation layer SHE, and such a pillar PL can be used as a dummy pillar in which an memory cell valid for reading and writing data is not formed even at the intersection with the word line WL.

The contact LI penetrates the insulating layers 54 to 52, the stacked structures LMa and LMb, and the junction layer JL between the stacked structures LMa and LMb, and reaches the plurality of $n^+$ diffusion regions 13 arranged on the substrate SB.

The sidewall of the contact LI is covered with, for example, an insulating layer 56 such as a $SiO_2$ layer, and the inside of an insulating layer 56 is filled with conductive layers 21 and 22. The conductive layer 21 is, for example, a polysilicon layer or the like and is arranged on the lower layer side of the contact LI. The conductive layer 22 is, for example, a tungsten layer or the like and is arranged on the upper layer side of the contact LI. The conductive layer 22 is connected to, for example, an upper layer wiring, which is not illustrated.

The configuration described above allows the contact LI to function as, for example, a source line contact. However, a configuration in which grooves extending in the X-direction and penetrating the stacked structures LMa and LMb or the like are filled with an insulating layer can be arranged to sandwich the lead-out region LR instead of the contact LI.

The separation layer SHE has a configuration in which an insulating layer such as a $SiO_2$ layer is filled in a groove extending in the X-direction and penetrating the selection gate line SGD of the stacked structure LMb. This allows the uppermost conductive layer of the stacked structure LMb to be partitioned as two selection gate lines SGDs in the region sandwiched between the two contacts LI.

The pillar PL penetrates the insulating layers 53 and 52, the stacked structures LMa and LMb, and the junction layer JL between the stacked structures LMa and LMb and reaches a predetermined depth of the substrate SB. The pillar PL includes a memory layer ME, a channel layer CN, and a core layer CR in this order from the outer peripheral side. The memory layer ME is a layer in which a block insulating layer BK, a charge accumulation layer CT, and a tunnel insulating layer TN are stacked in this order from the outer peripheral side of the pillar PL. The channel layer CN is also arranged near the lower end portion of the pillar PL.

The block insulating layer BK, the tunnel insulating layer TN, and the core layer CR are, for example, a $SiO_2$ layer or the like. The charge accumulation layer CT is, for example, a SiN layer or the like. The channel layer CN is, for example, an amorphous silicon layer, a polysilicon layer, or the like.

The pillar PL is provided with an epitaxial layer EP of silicon or the like protruding to a predetermined depth of the substrate SB at the lower end portion. The channel layer CN that penetrates from the upper surface of the epitaxial layer EP to a predetermined depth is connected on the epitaxial layer EP.

A cap layer CP, which is an amorphous silicon layer, a polysilicon layer, or the like, is arranged at the upper end portion of the core layer CR and is connected to the channel layer CN on the outer circumference. The cap layer CP is connected to an upper layer wiring such as a bit line, which is not illustrated.

The configuration described above allows a plurality of memory cells MC arranged in the height direction to be formed at the intersection between the pillar PL and each word line WL. The accumulation or the like of a predetermined charge in the charge accumulation layer CT of the memory cell MC allows data to be held in the individual memory cells MC illustrated in FIG. 3E. A predetermined voltage, such as a read voltage or a write voltage, applied from the contact CC connected to the word line WL via each word line WL arranged at the same height position as the individual memory cells MC allows reading and writing data from and to each memory cell MC.

Further, selection gates STD and STS are formed respectively at an intersection between the pillar PL and the selection gate line SGD and an intersection between the pillar PL and the selection gate line SGS, as illustrated in FIGS. 3D and 3F. A predetermined voltage is applied from the contact CC connected to each of the selection gates STD and STS via the selection gate lines SGD and SGS. This voltage application allows the selection gates STD and STS to be turned on/off and the memory cell MC of the pillar PL to which the selection gates STD and STS belong to be in the selected state or the non-selected state.

As illustrated in FIGS. 3B and 3C, the configuration of individual contacts CC is as described above. In FIGS. 3B and 3C, contacts CC connected to the word lines WL of different layers are illustrated exemplarily one by one. The contact CC illustrated in FIG. 3B is connected to a predetermined word line WL of the stacked structure LMb. The contact CC illustrated in FIG. 3C is connected to a predetermined word line WL of the stacked structure LMa.

(Method of Manufacturing Semiconductor Storage Device)

An example of a method of manufacturing the semiconductor storage device 1 according to the embodiment is now described with reference to FIGS. 4A to 13C. FIGS. 4A to 13C are sectional views illustrating an example of a procedure of a method of manufacturing the semiconductor storage device 1 according to the embodiment.

In drawing numbers of FIGS. 4A to 4C and 7A to 13C, letters A, B, and C indicate different sections during the same processing process. The letter A of FIGS. 4A to 4C and 7A to 13C corresponds to the part of FIG. 3A, the letter B corresponds to the part of FIG. 3B, and the letter C corresponds to the part of FIG. 3C.

Figure 4A:
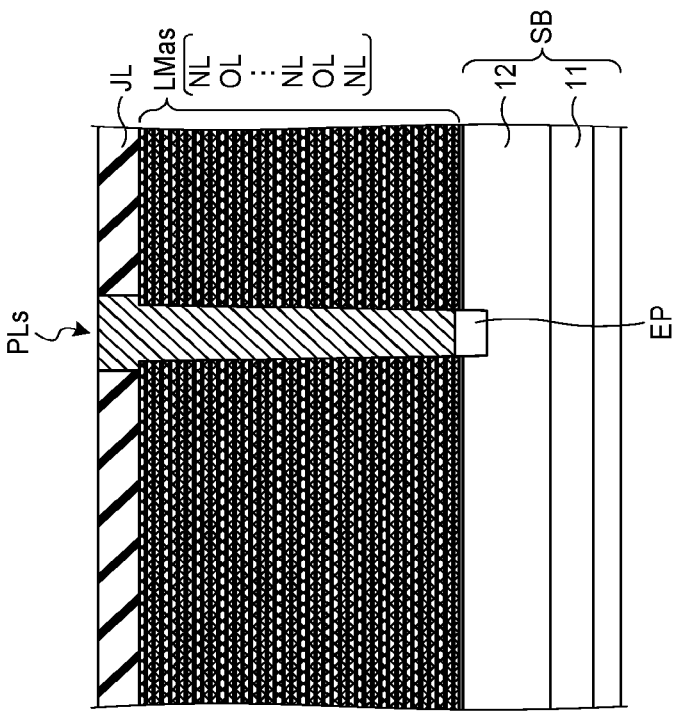
FIGS. 4A to 4C are sectional views illustrating an example of a procedure of a method of manufacturing the semiconductor storage device according to the embodiment.

As illustrated in FIG. 4A, the peripheral circuit PER including the transistor TR is formed on the substrate SB on which n-well 11, p-well 12, or the like is formed. After the formation of a stacked structure LMas described later, the peripheral circuit PER is covered with the insulating layer 51 up to the height position of the stacked structure LMas. In the insulating layer 51, there is formed a hole that penetrates the insulating layer 51 and is connected to the transistor TR. The hole is filled inside with a sacrificial layer such as an amorphous silicon layer so as to form a contact LCSs, which is later to be a substructure of the contact CS.

Figure 4B:
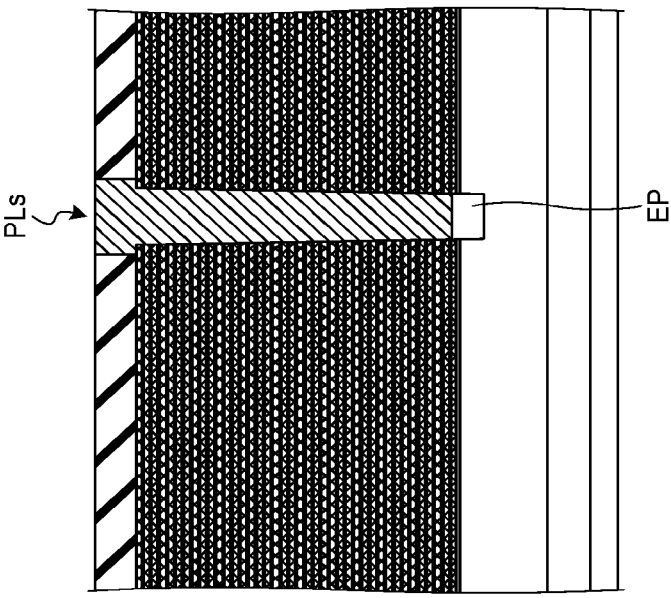
Figure 4C:
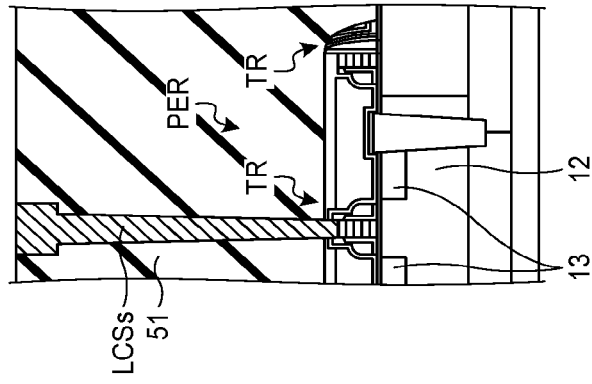

As illustrated in FIGS. 4B and 4C, the stacked structure LMas in which a sacrificial layer NL and an insulating layer OL are alternately stacked multiple times is formed in a region on the substrate SB where the stacked structure LMa is to be formed. The sacrificial layer NL is, for example, a SiN layer or the like and is later replaced with a conductive material to be the word line WL and the selection gate line SGS. The junction layer JL is formed on the stacked structure LMas.

A memory hole is then formed, which penetrates the junction layer JL and the stacked structure LMas and reaches a predetermined depth of the substrate SB. At the bottom of the memory hole, for example, silicon or the like is grown epitaxially to fit the crystal structure of the substrate SB. This allows the epitaxial layer EP to be formed at the bottom of the memory hole. Then, the memory hole is filled inside with a sacrificial layer such as an amorphous silicon layer, and the pillar PLs, which later is to be a substructure of the pillar PL, is formed.

As illustrated in FIGS. 5A to 5D and 6A to 6C, a plurality of contact holes is formed, each of which reaches a different depth in the stacked structure LMas and is connected to a sacrificial layer NL of a different layer among the plurality of sacrificial layers NL.

FIGS. 5A to 5D are sectional views illustrating an example of a method of forming a plurality of contact holes in one lead-out region LR.

Figure 5A:
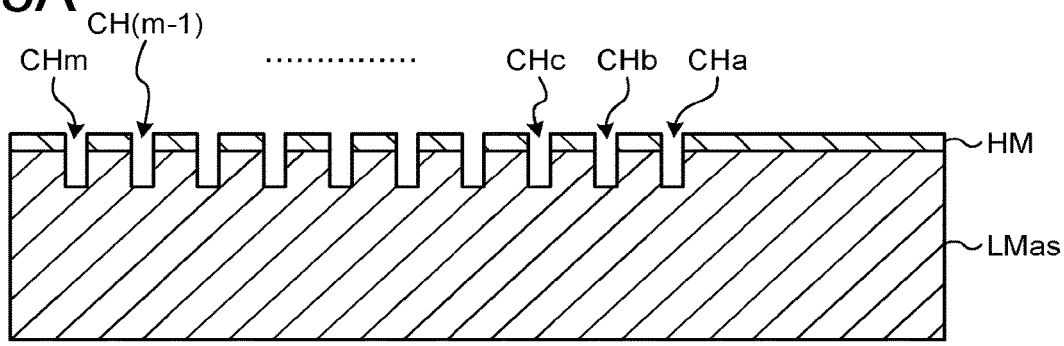
FIGS. 5A to 5D are sectional views illustrating the example of the procedure of the method of manufacturing the semiconductor storage device according to the embodiment.

As illustrated in FIG. 5A, a hard mask HM having a plurality of hole patterns is formed on the stacked structure LMas. The hard mask HM is a layer that is not removed by $O_2$ plasma or the like. More specifically, as the hard mask HM, a layer of a silicon-based material such as an amorphous silicon layer or a polysilicon layer can be used.

Using the hard mask HM as a mask, the stacked structure LMas is etched to a predetermined depth to form a plurality of contact holes CHa, CHb, CHc, . . . , CH(m−1), and CHm (where m is an integer of five or more). In this event, the depths at which the respective contact holes CHa to CHm reach in the stacked structure LMas are substantially equal.

Figure 5B:
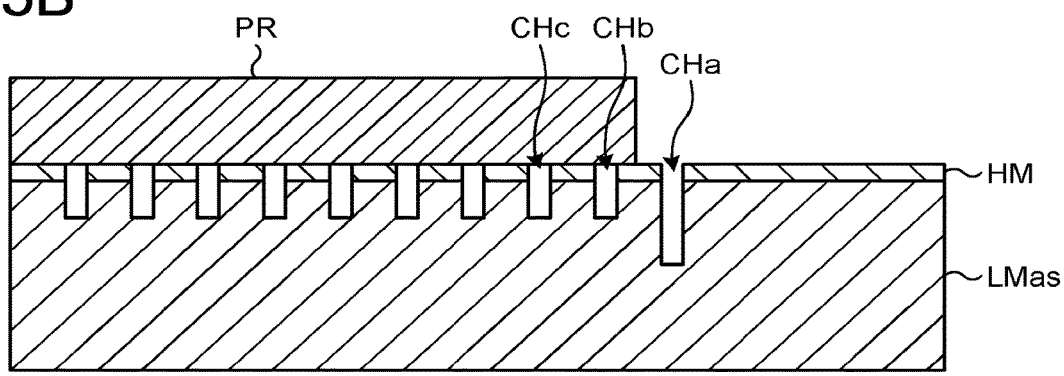

As illustrated in FIG. 5B, a plurality of contact holes CHb to CHm is covered, and only the outermost contact hole CHa among the contact holes CHa to CHm is exposed to form a mask PR. The mask PR is a layer that is removable by $O_2$ plasma or the like. More specifically, in one example, as the mask PR, a layer of organic material such as a photoresist layer can be used.

The contact hole CHa exposed from the mask PR is further etched to cause the contact hole CHa to reach a deeper depth in the stacked structure LMas.

Figure 5C:
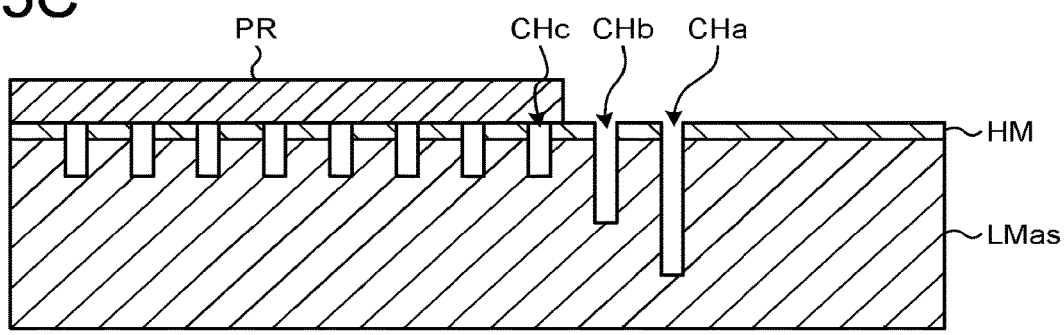

As illustrated in FIG. 5C, the end portion of the mask PR is retracted by, for example, slimming using $O_2$ plasma or the like to expose the contact hole CHb adjacent to the contact hole CHa.

The contact hole CHb exposed from the mask PR is etched to cause the contact hole CHb to reach a deeper depth in the stacked structure LMas. In this event, the contact hole CHa is also etched, and so the depth at which the contact hole CHa in the stacked structure LMas reaches is further deepened.

Figure 5D:
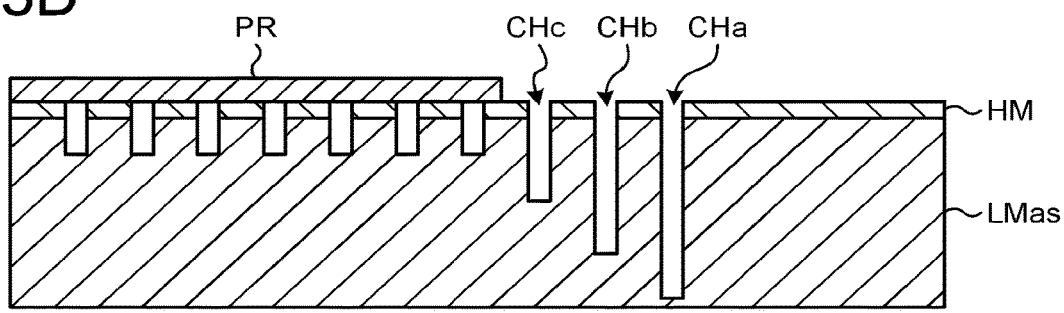

As illustrated in FIG. 5D, the end portion of the mask PR is retracted by, for example, slimming using $O_2$ plasma or the like to expose the contact hole CHc adjacent to the contact hole CHb.

The contact hole CHc exposed from the mask PR is etched to cause the contact hole CHc to reach a deeper depth in the stacked structure LMas. In this event, the contact holes CHa and CHb are also etched, and the depth at which the contact holes CHa and CHb reach in the stacked structure LMas is more deepened and they are at different depth positions.

As described above, the repetitive slimming of the mask PR and etching of the stacked structure LMas make it possible to reach different depths in the stacked structure LMas to form a plurality of contact holes connected to the sacrificial layers NL of different layers. Moreover, the techniques of FIGS. 5A to 5D allow the contacts CC belonging to one lead-out region LR to be arranged in the order in which the reaching depth is increased toward a predetermined direction.

Figure 6A:
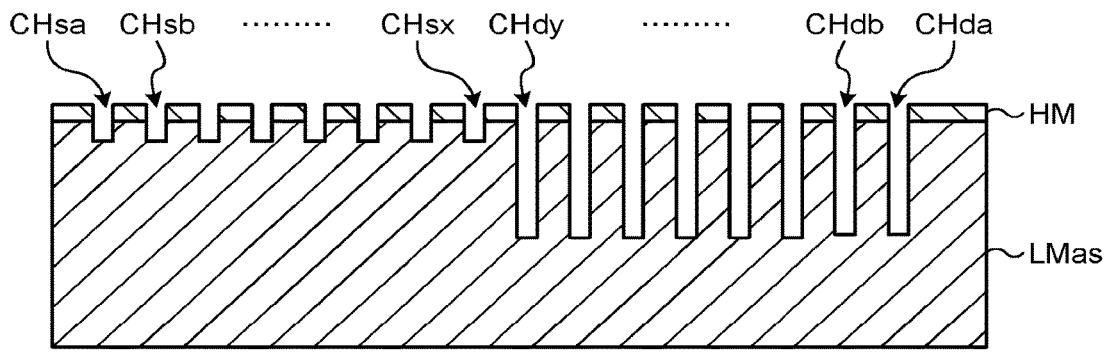
FIGS. 6A to 6C are sectional views illustrating the example of the procedure of the method of manufacturing the semiconductor storage device according to the embodiment.
Figure 6B:
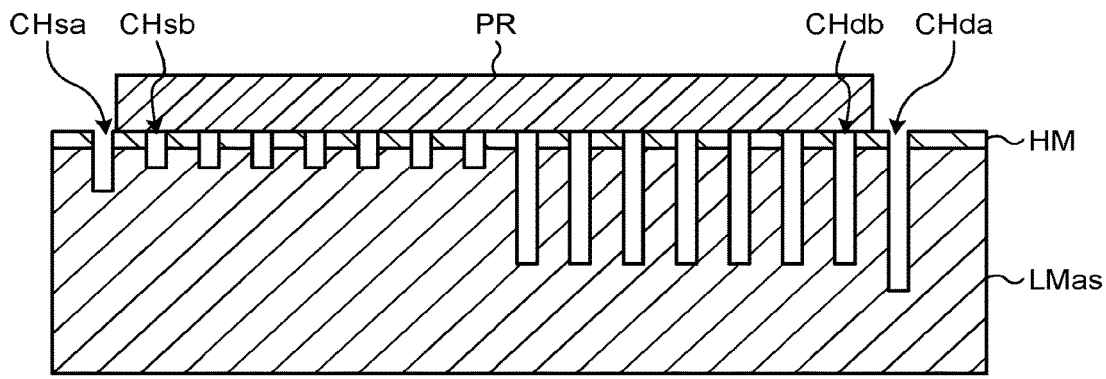
Figure 6C:
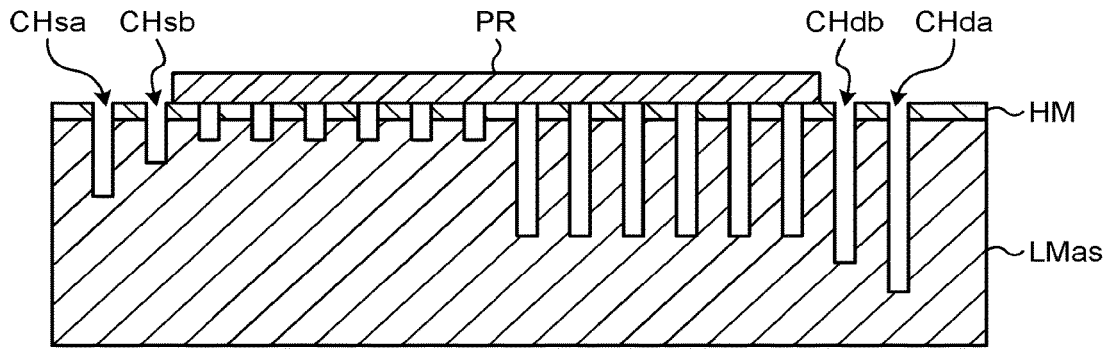

FIGS. 6A to 6C are sectional views illustrating another example of a method of forming a plurality of contact holes in one lead-out region LR.

As illustrated in FIG. 6A, the hard mask HM having a plurality of hole patterns is formed on the stacked structure LMas.

Using the hard mask HM as a mask, the stacked structure LMas is etched to a predetermined depth to form a plurality of contact holes CHsa, CHsb, . . . , and CHsx (where x is an integer of three or more). In this event, the depths at which the respective contact holes CHsa to CHsx reach in the stacked structure LMas are substantially equal.

Using the hard mask HM as a mask, the stacked structure LMas is etched to a predetermined depth deeper than the reaching depth of the contact holes CHsa to CHsx to form a plurality of contact holes CHda, CHdb, . . . , and CHdy (where y is an integer of three or more). In this event, the depths at which the respective contact holes CHda to CHdy reach in the stacked structure LMas are substantially equal.

In this way, it is possible to form two types of contact holes CHsa to CHsx and CHda to CHdy with different depths separately. This is sufficiently achieved, by, for example, covering the other type of contact holes CHsa to CHsx and CHda to CHdy with a resist mask or the like, upon forming the respective contact holes CHsa to CHsx and CHda to CHdy.

As illustrated in FIG. 6B, the mask PR is formed to cover a plurality of contact holes CHsb to CHsx and CHdb to CHdy and to expose only the contact holes CHsa and CHda formed at both end portions of the contact holes CHsa to CHsx and CHda to CHdy.

The contact holes CHsa and CHda exposed from the mask PR is further etched to cause the contact holes CHsa and CHda to reach a deeper depth in the stacked structure LMas. The contact holes CHsa and CHda have different reaching depths before the additional etching, so they reach different depths even after the additional etching.

As illustrated in FIG. 6C, the end portion of the mask PR is retracted by, for example, slimming using $O_2$ plasma or the like to expose the contact hole CHsb adjacent to the contact hole CHsa, and the contact hole CHdb adjacent to the contact hole CHda.

The contact holes CHsb and CHdb exposed from the mask PR is etched to cause the contact holes CHsb and CHdb to reach a deeper depth in the stacked structure LMas. The contact holes CHsb and CHdb have different reaching depths before the additional etching, so they reach different depths even after the additional etching.

Further, in this event, the contact holes CHsa and CHda are also etched, and the depth at which the contact holes CHsa and CHda reach in the stacked structure LMas is further deepened. The difference between depths at which the contact holes CHsa and CHda reach is maintained.

As described above, the repetitive slimming of the mask PR and etching of the stacked structure LMas make it possible to reach different depths in the stacked structure LMas to form a plurality of contact holes connected to the sacrificial layers NL of different layers.

The individual forming of two types of contact holes CHsa to CHsx and CHda to CHdy of different depths makes it possible to reduce, in principle, the number of processes to, for example, ½ as compared with the methods illustrated in FIGS. 5A to 5D, achieving up to twice the efficiency.

Moreover, according to the techniques of FIGS. 6A to 6C, the contacts CC belonging to one lead-out region LR are divided into two contact groups of first and second contact groups. The first contact group includes a plurality of contacts CC having a reaching depth less than a predetermined depth, and the second contact group includes a plurality of contacts CC having a reaching depth of the predetermined depth or more. Then, in one contact group, at least some of the plurality of contacts CC are arranged in the order in which the reaching depth is shallower toward a predetermined direction. In addition, in the other contact group, at least some of the plurality of contacts CC are arranged in the order in which the reaching depth is deepened toward the predetermined direction.

In this way, various methods of forming a plurality of contact holes can be considered. The plurality of contact holes can be formed using other methods than those illustrated in FIG. 5A to 5D or 6A to 6C.

As illustrated in FIG. 7C, the insulating layer 55 is formed on the sidewall and the bottom surface of the contact hole formed in the stacked structure LMas, and a sacrificial layer such as an amorphous silicon layer is filled inside the insulating layer 55. This allows a contact LCCs, which is later to be a substructure of the contact CC illustrated in FIG. 3C, to be formed.

Moreover, the contact CC illustrated in FIG. 3B does not have a substructure in the stacked structure LMas of FIG. 7B corresponding to FIG. 3B. Thus, there is no contact hole or contact LCCs formed in the region of FIG. 7B.

As illustrated in FIGS. 8B and 8C, the stacked structure LMbs in which the sacrificial layer NL and the insulating layer OL are alternately stacked multiple times is formed on the junction layer JL. The sacrificial layer NL is, for example, a SiN layer or the like and is later replaced with a conductive material to be the word line WL and the selection gate line SGD. The insulating layer 52 is formed on the stacked structure LMbs, and the insulating layer 53 is formed on the insulating layer 52.

Then, a plurality of memory holes is formed, which penetrates the insulating layers 53 and 52 and the stacked structure LMbs and is connected to each of the plurality of pillars PLs exposed on the upper surface of the junction layer JL. The sacrificial layer filled in the pillar PLs is removed through these memory holes. This allows a plurality of memory holes MH that penetrates the insulating layers 53 and 52, the stacked structure LMbs, the junction layer JL, and the stacked structure LMas to be formed. The epitaxial layer EP is exposed at the bottom of each memory hole MH.

As illustrated in FIG. 8A, the insulating layer 51, which reaches at least the height of the upper surface of the stacked structure LMbs and, for example, reaches the height of the upper surface of the insulating layer 52, is additionally formed. In other words, the insulating layer 51 that covers the peripheral circuit PER is further stacked. The insulating layer 53 is formed on the insulating layer 51.

As illustrated in FIGS. 9B and 9C, the block insulating layer BK, the charge accumulation layer CT, and the tunnel insulating layer TN are stacked from the outer peripheral side in the memory hole MH to form the memory layer ME. The memory layer ME is also formed on the bottom surface of the memory hole MH, so the memory layer ME on the bottom surface is removed, and the exposed epitaxial layer EP is recessed to a predetermined depth. The memory layer ME is formed not only in the memory hole MH but also on the upper surface of the insulating layer 53. However, in removing the memory layer ME on the bottom surface of the memory hole MH, the memory layer ME on the upper surface of the insulating layer 53 is also removed.

Then, the channel layer CN is formed inside the memory layer ME on the sidewall of the memory hole MH and on the bottom surface of the memory hole MH. This formation allows the channel layer CN to be formed on the upper surface of the epitaxial layer EP and to enter a predetermined depth of the epitaxial layer EP. The core layer CR is formed inside the channel layer CN.

Then, the upper end of the core layer CR exposed on the upper surface of the insulating layer 53 is selectively removed. In this event, the upper surface itself of the insulating layer 53 is covered with the channel layer CN and the core layer CR, and at least the channel layer CN of these layers becomes an etch stopper layer to protect the upper surface of the insulating layer 53. The cap layer CP is formed in the recess from which the upper end portion of the core layer CR is removed. The channel layer CN and the cap layer CP that are unnecessary on the upper surface of the insulating layer 53 are removed.

Thus, the pillar PL is formed. Then, the upper surface of the insulating layer 53 including the pillar PL is covered with the insulating layer 54.

As illustrated in FIG. 9A, above the peripheral circuit PER, the insulating layer 54 covers the insulating layer 51.

As illustrated in FIGS. 10B and 10C, a plurality of contacts UCCs is formed.

As illustrated in FIG. 10B, some of a plurality of contacts UCCs penetrate the insulating layers 54 to 52, reach different depths in the stacked structure LMbs, and are connected to the sacrificial layer NL of a different layer of the plurality of sacrificial layers NL. It is possible to form such a contact UCCs similarly to that of the contact LCCs described above, for example. In other words, contact holes that reach different depths in the stacked structure LMbs are connected to the sacrificial layer NL of a different layer among the plurality of sacrificial layers NL are formed, and the insulating layer 55 is formed on the sidewall and the bottom surface of the contact hole. The inside of the insulating layer 55 is filled with a sacrificial layer such as an amorphous silicon layer.

As illustrated in FIG. 10C, some contacts of the plurality of contacts UCCs penetrate the insulating layers 54 to 52 and the stacked structure LMbs and is connected to the contact LCCs formed in the stacked structure LMas. In other words, a contact hole is formed, which penetrates the insulating layers 54 to 52 and the stacked structure LMbs and is connected to the contact LCCs. The insulating layer 55 is formed on the sidewall and the bottom surface of the contact hole, and the inside of the insulating layer 55 is filled with a sacrificial layer such as an amorphous silicon layer. Such contact UCCs has a superstructure of the contact CC that reaches different depths in the stacked structure LMa, like the contact CC illustrated in FIG. 3C.

As illustrated in FIGS. 11B and 11C, there is formed a plurality of slits ST that extend in the X-direction, penetrate the insulating layers 54 to 52, the stacked structures LMbs and LMas, and the junction layer JL, and reach the p-well 12 of the substrate SB. In addition, a groove is formed between the slits ST. The groove extends in the X-direction and penetrates the insulating layers 54 to 52 to separate the sacrificial layer NL of the uppermost layer of the stacked structure LMbs. The inside of the groove is filled with the insulating layer to form the separation layer SHE.

As illustrated in FIGS. 12B and 12C, the sacrificial layer NL provided in the stacked structures LMas and LMbs is replaced with the word line WL or the like to form the stacked structures LMa and LMb.

In other words, the sacrificial layer NL of the stacked structures LMas and LMbs is removed through the plurality of slits ST. This removal causes the stacked structures LMas and LMbs to have a vulnerable structure having a gap between the insulating layers OL. The plurality of pillars PL arranged in a matrix supports such a vulnerable structure. In addition, the insulating layer 55 is formed on the sidewall of the contacts LCCs and UCCs, so it is possible to prevent the sacrificial layers filled in the contacts LCCs and UCCs from being removed.

Then, the gap between the insulating layers OL is filled with a conductive material such as tungsten or molybdenum through the plurality of slits ST to form the word line WL and the selection gate lines SGD and SGS. This allows the plurality of word lines WL and the insulating layers OL to be alternately stacked, and so the stacked structures LMa and LMb having selection gate lines SGD and SGS are formed.

In this way, the processing of replacing the sacrificial layer NL with the word line WL is sometimes referred to as replacement processing.

As illustrated in FIGS. 13B and 13C, the diffusion region 13 is formed in the p-well 12, which is exposed at the bottom of the slit ST, of the substrate SB. In addition, the insulating layer 56 that covers the sidewall of the slit ST is formed, and the conductive layer 21, such as a polysilicon layer, is formed inside the insulating layer 56 and at the lower part of the slit ST. The conductive layer 22, such as a tungsten layer, is formed at the upper part of the slit ST. This allows the plurality of contacts LI to be formed. However, the slit ST can be filled with an insulating layer to form a structure that does not function as the source line contact.

Then, in the region where the peripheral circuit PER is formed, a hole is formed, which penetrates the insulating layers 54 and 53, reaches a predetermined depth of the insulating layer 51, and is connected to the contact LCSs. In addition, a groove is formed, which penetrates an insulating layer, which is not illustrated and the insulating layers 54 and 53 on the upper layer of the hole and is connected to the hole. In addition, the sacrificial layer in the contact LCSs is removed through such groove and hole, and a tungsten layer or the like is filled. This allows the contact CS connected to the transistor TR and the wiring layer MX connected to the contact CS to be formed.

Further, in the region where the contact UCCs is formed, a groove is formed, which penetrates an insulating layer, which is not illustrated and the insulating layers 54 and 53 above the contact UCCs and is connected to the contact UCCs.

Further, among the plurality of contacts UCCs, the sacrificial layer in the contact UCCs connected to the word line WL or the selection gate line SGD of the stacked structure LMb and the insulating layer 55 on the bottom surface of the contact UCCs are removed through the groove to be connected to the contact UCCs. Then, a contact hole having the insulating layer 55 on the sidewall is formed. In addition, the inside of the insulating layer 55 of the contact hole and the inside of the groove connected to the contact hole are filled with a conductive layer such as a tungsten layer so as to form the contact CC connected to the selection gate line SGD or the word line WL of a different layer in the stacked structure LMb, and the wiring layer MX connected to the contact CC.

Further, among the plurality of contacts UCCs, in the contacts UCCs and LCCs connected to the word line WL or the selection gate line SGS of the stacked structure LMa, the sacrificial layer in the contact UCCs and the insulating layer 55 on the bottom surface of the contact UCCs are removed through the groove to be connected to the contact UCCs. Furthermore, the sacrificial layer in the contact LCCs and the insulating layer 55 on the bottom surface of the contact LCCs are removed. This allows a contact hole that penetrates the insulating layers 54 to 52 and the stacked structure LMb and reaches a different depth in the stacked structure LMa to be formed. In addition, the inside of the insulating layer 55 of the contact hole and the inside of the groove connected to the contact hole are filled with a conductive layer such as a tungsten layer. This allows the contact CC connected to the selection gate line SGS of the stacked structure LMa or the word line WL of a different layer, and the wiring layer MX connected to the contact CC to be formed.

Moreover, in removing the sacrificial layer in the contacts LCCs and UCCs, the word line WL and selection gate lines SGD and SGS, such as a tungsten layer, are previously formed outside the contacts LCCs and UCCs. However, the insulating layer 55 provided on the sidewall of the contacts LCCs and UCCs enables the word line WL or the like to be prevented from being removed.

Further, the plurality of pillars PL is connected to an upper layer wiring such as a bit line, which is not illustrated.

As described above, the semiconductor storage device 1 according to an embodiment is manufactured.

A semiconductor storage device such as three-dimensional nonvolatile memory is provided with a stairway area where the conductive layer is formed in a stepped shape and terminated at one end portion or both end portions in the X-direction of a stacked structure in which conductive layers such as a word line are stacked. In the stairway area, the individual conductive layers stacked in multiple layers are led out as described above, so it is possible to apply a predetermined voltage to the individual conductive layers.

However, for example, the voltage applied to the conductive layer in the stairway area decreases as the distance from the stairway area increases, and so the potential variations occur in the same conductive layer sometimes. For this reason, the threshold voltage will drop in the memory cell connected to the conductive layer in the region where the potential is dropped. This is because if the potential of the word line is low, it is difficult for electrons to be injected into the charge accumulation layer through the tunnel insulating layer.

Further, the pillar used for forming the memory cell fails to be arranged in the stairway area, so the size occupied by the memory area in the stacked structure will be reduced by the magnitude of the stairway area. In addition, in performing the replacement processing in which the sacrificial layer is replaced with the conductive layer, a structure that supports the stairway area is sometimes arranged in the stairway area instead of the pillar, and in this case, the size of the stairway area will be further increased.

According to the semiconductor storage device 1 of the embodiment, there is provided a plurality of contacts CC arranged in a mixed way with a plurality of pillars PL in a region other than the end portions of the stacked structures LMa and LMb. In addition, there is provided a plurality of contacts CC arranged in a region other than the end portions of the stacked structures LMa and LMb different from the plurality of contacts CC described above. This plurality of contacts CC is arranged separately in a mixed way with a plurality of pillars PL, and is connected to the word line WL or the selection gate lines SGD and SGS identical to those of the plurality of contacts CC.

Thus, there is a plurality of contacts CC connected to the same word line WL or the like, and so it is possible to apply a voltage of the same potential to, for example, the same word line WL or the like in different regions of the stacked structures LMa and LMb. Thus, it is possible to reduce or eliminate the voltage drop over the entire stacked structures LMa and LMb and the variations in potentials in the same word line WL or the like. This makes it possible to maintain the threshold voltage of a plurality of memory cells MC connected to the same word line WL or the like at the desired value.

According to the semiconductor storage device 1 of the embodiment, each of the plurality of contacts CC in the same lead-out region LR reaches a different depth in the stacked structures LMa and LMb, and is connected to the word line WL or the selection gate lines SGD and SGS in a different layer.

Thus, it is possible to arrange a plurality of contacts CC in a mixed way with a plurality of pillars PL in the memory region MR without providing a stairway area separately from the memory region MR. Thus, it is possible to eliminate the stairway area where the pillar PL fails to be arranged, allowing increasing the size occupied by the memory region MR in the stacked structures LMa and LMb. The structure that supports the stairway area is also unnecessary, and it is possible to further increase the memory region MR. Alternatively, it is possible to reduce the size of the stacked structures LMa and LMb while maintaining the capacity in the memory region MR, allowing reducing the size of the semiconductor storage device 1.

(Modification)

In the above-described embodiment, the contacts LCCs and UCCs are separately formed in the individual stacked structures LMas and LMbs. However, the contact CC has a larger diameter and a lower aspect ratio than, for example, the pillar PL, so it is possible to collectively form the contact CC after forming the stacked structures LMas and LMbs.

A method of forming a contact CC different from that of the above-described embodiment is described below with reference to FIGS. 14A to 16C. FIGS. 14A to 16C are sectional views illustrating an example of a procedure of a method of manufacturing a semiconductor storage device according to a modification of the embodiment.

In drawing numbers of FIGS. 14A to 16C, letters A, B, and C indicate different sections during the same processing process. The letter A of FIGS. 14A to 16C corresponds to the part of FIG. 3A, the letter B corresponds to the part of FIG. 3B, and the letter C corresponds to the part of FIG. 3C, which are incorporated in the present modification.

FIGS. 14A to 14C are views corresponding to FIGS. 9A to 9C of the above-described embodiment, respectively, and illustrate states after performing the pillar PL formation processing. However, in the method of manufacturing a semiconductor storage device according to the modification, the formation of the contact CC is started after the processing illustrated in FIGS. 14A to 14C.

As illustrated in FIGS. 14A to 14C, the hard mask HM is formed on the insulating layer 54, and the mask PR having a plurality of hole patterns HLp is formed on the hard mask HM. The pattern of the mask PR is transferred to the hard mask HM to form a plurality of hole patterns HLh on the hard mask HM.

Then, there is formed a plurality of contact holes in the same manner as the formation of LCCs in the above-described embodiment, each of which reaches a different depth in the stacked structure LMas or LMbs and is connected to the sacrificial layer NL of a different layer among the plurality of sacrificial layers NL. In other words, a mask such as a photoresist that covers the plurality of hole patterns HLh is formed on the hard mask HM, and processing of slimming the mask by $O_2$ plasma or the like and etching the stacked structures LMas and LMbs is repeated.

Figure 15A:
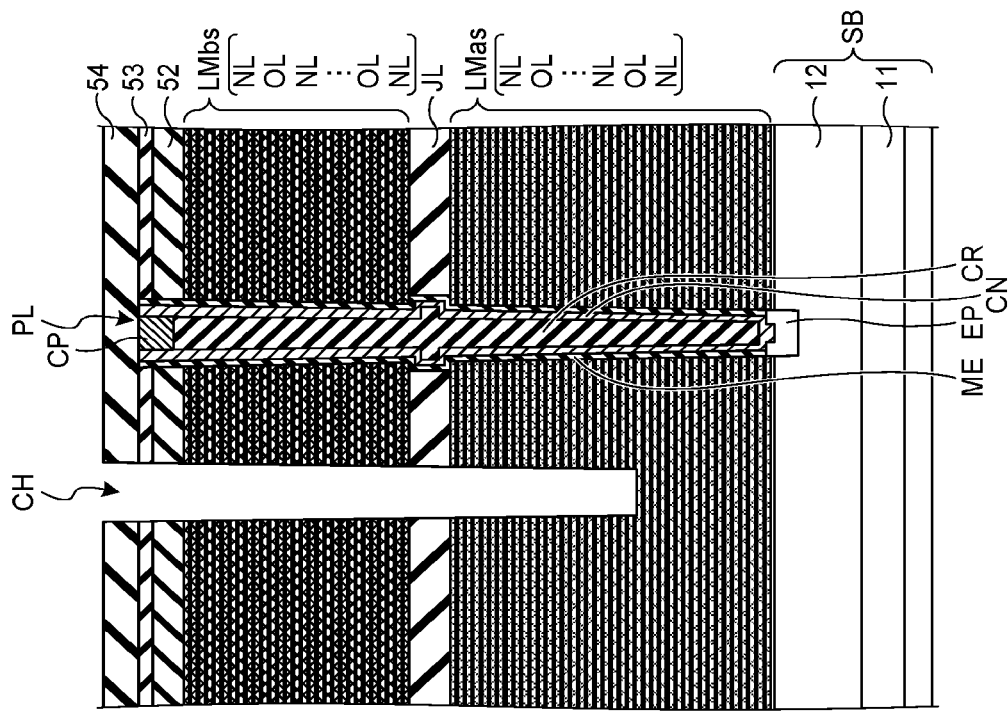
FIGS. 15A to 15C are sectional views illustrating the example of the procedure of the method of manufacturing the semiconductor storage device according to the modification of the embodiment.
Figure 15B:
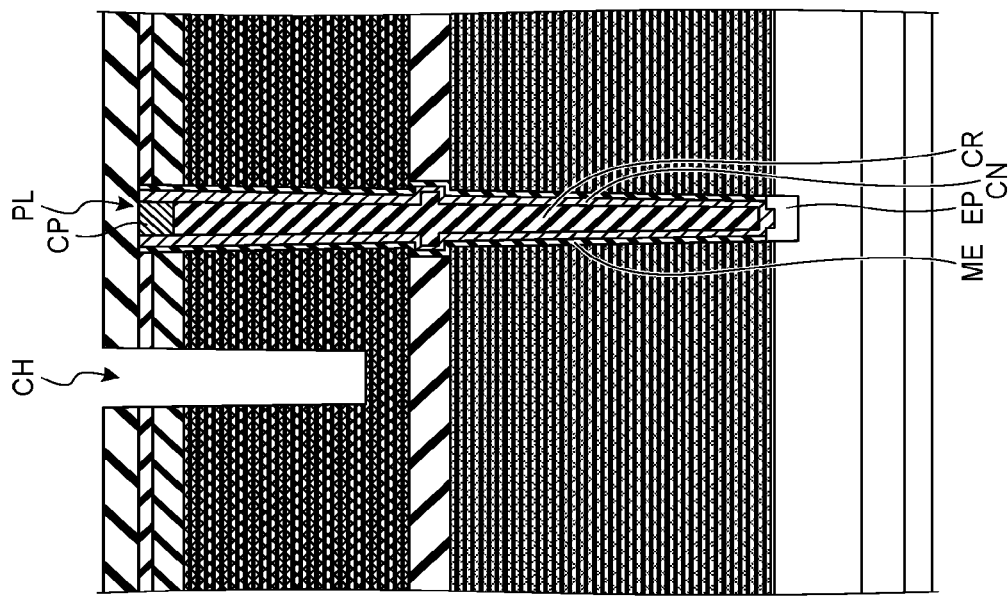
Figure 15C:
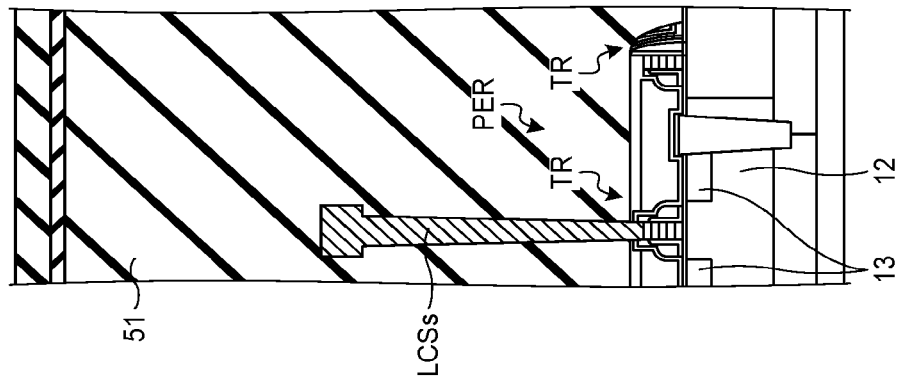

As illustrated in FIGS. 15B and 15C, as described above, a plurality of contact holes CH having different reaching depths in the stacked structures LMas and LMbs can be obtained.

As illustrated in FIGS. 16B and 16C, the insulating layer 55 is formed on the sidewall and the bottom surface of the contact hole CH, and the inside of the insulating layer 55 is filled with a sacrificial layer such as an amorphous silicon layer. This makes it possible to obtain the plurality of contacts CCs having different reaching depths in the stacked structures LMas and LMbs.

Then, in one example, the processing of FIGS. 11A to 13C of the above-described embodiment is performed. In addition, a groove is formed, which penetrates the insulating layer not illustrated and the insulating layers 54 and 53 on the upper layer of the contact CCs and is connected to the contact CCs. The sacrificial layer in the contact CCs and the insulating layer 55 on the bottom surface of the contact CCs are removed via the groove connected to the contact CCs so as to form a contact hole having the insulating layer 55 on the sidewall. In addition, the inside of the insulating layer 55 of the contact hole and the inside of the groove connected to the contact hole are filled with a conductive layer such as a tungsten layer so as to form the contact CC connected to the selection gate lines SGD and SGS of the stacked structures LMa and LMb or the word line WL of a different layer, and the wiring layer MX connected to the contact CC. In addition, the plurality of pillars PL is connected to an upper layer wiring such as a bit line, which is not illustrated.

As described above, the semiconductor storage device according to the modification of the embodiment is manufactured.

According to the semiconductor storage device according to the modification, it is possible to form a plurality of contacts CC using different methods in a similar manner to the above-described embodiment. Thus, the semiconductor storage device according to the modification also has a similar effect to that of the semiconductor storage device 1 according to the above-described embodiment.

(Other Modifications)

In the embodiment and modification described above, the semiconductor storage device is provided, as the conductive layer, with the stacked structures LMa and LMb including the word line WL and the selection gate lines SGD and SGS that are a metal layer such as a tungsten layer. However, the conductive layer of the stacked structure can be a layer including a silicon material such as a polysilicon layer. In the embodiment and modification described above, it is possible to provide a plurality of contacts CC connected to the same word line WL or the like in a region other than the end portion of the stacked structure. Thus, even if a silicon material having a resistance higher than that of metal is used, it is very efficient in reducing or eliminating the variations of potentials between the regions in the word line WL or the like. In this case, from the beginning, a stacked structure in which layers including a silicon material are stacked is formed, and the semiconductor storage device is manufactured without including the replacement processing.

In the embodiment and modification described above, the semiconductor storage device is provided with a 2-tier (two-stage) structure including two stacked structures LMa and LMb. However, the semiconductor storage device can have a structure of 1-tier or 3-tier or more.

In the embodiment and modification described above, the semiconductor storage device includes the stacked structures LMa and LMb stacked on the substrate SB, and includes the peripheral circuit PER arranged on the substrate SB outside the stacked structures LMa and LMb. However, the stacked structures LMa and LMb of the semiconductor storage device can be stacked above the peripheral circuit PER via a source line such as a polysilicon layer. Alternatively, the peripheral circuit PER can be arranged above the stacked structures LMa and LMb by forming the stacked structures LMa and LMb and the peripheral circuit PER on different substrates and bonding these substrates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
  a stacked structure in which a plurality of conductive layers is stacked in a stacking direction via an insulating layer;
  a plurality of pillars extending in the stacking direction in the stacked structure and including a memory cell formed at an intersection between at least a part of the plurality of conductive layers and at least a part of the plurality of pillars;
  a plurality of first contacts arranged in the stacked structure, each of the first contacts reaching a different depth in the stacked structure and being connected to a conductive layer in a different layer among the plurality of conductive layers; and a plurality of second contacts arranged in the stacked structure separately from the plurality of first contacts, each of the second contacts reaching a different depth in the stacked structure and being connected to a conductive layer identical to the conductive layer to which a corresponding one of the plurality of first contacts is connected.

2. The semiconductor storage device according to claim 1, wherein one of the plurality of second contacts and the corresponding one of the plurality of first contacts are electrically connected to the memory cell formed at a height position of a corresponding conductive layer via the corresponding conductive layer among the plurality of conductive layers.

3. The semiconductor storage device according to claim 1, wherein each of the plurality of conductive layers has a longitudinal direction along a first direction intersecting the stacking direction, and a first contact and a second contact connected to a conductive layer identical among the plurality of first and second contacts are arranged in the stacked structure at a predetermined distance in the first direction.

4. The semiconductor storage device according to claim 3, wherein the first contact and the second contact connected to the identical conductive layer apply a voltage of identical potential to the conductive layer to which the first contact and the second contact are connected in different regions of the stacked structure.

5. The semiconductor storage device according to claim 3, wherein at least one of the first contact and the second contact connected to the identical conductive layer is arranged in a region other than an end portion of the stacked structure in the first direction.

6. The semiconductor storage device according to claim 1, wherein
each of the plurality of conductive layers has a longitudinal direction along a first direction intersecting the stacking direction,
the plurality of first contacts is arranged in a local first region of the stacked structure,
the plurality of second contacts is arranged in a local second region of the stacked structure, and
the first and second regions are arranged apart from each other in the first direction.

7. The semiconductor storage device according to claim 6, wherein at least one of the first and second regions is arranged in a region other than an end portion of the stacked structure in the first direction.

8. The semiconductor storage device according to claim 6, wherein a part of the plurality of pillars is arranged in the first and second regions.

9. The semiconductor storage device according to claim 1, wherein each of the plurality of first contacts and each of the plurality of second contacts are arranged in the stacked structure in a mixed way with the plurality of pillars.

10. The semiconductor storage device according to claim 9, wherein each of the plurality of conductive layers has a longitudinal direction along a first direction intersecting the stacking direction, and a part of the plurality of pillars is arranged to extend in the stacking direction in the stacked structure between two first contacts adjacent in the first direction among the plurality of first contacts.

* * * * *